(12) United States Patent
Seol et al.

(10) Patent No.: US 11,034,847 B2
(45) Date of Patent: Jun. 15, 2021

(54) HARDMASK COMPOSITION, METHOD OF FORMING PATTERN USING HARDMASK COMPOSITION, AND HARDMASK FORMED FROM HARDMASK COMPOSITION

(71) Applicant: Samsung Electronics Co., Ltd., Suwon-si (KR)

(72) Inventors: Minsu Seol, Seoul (KR); Sangwon Kim, Seoul (KR); Hyeonjin Shin, Suwon-si (KR); Dongwook Lee, Suwon-si (KR); Seongjun Park, Seoul (KR); Yunseong Lee, Osan-si (KR); Seongjun Jeong, Hwaseong-si (KR); Alum Jung, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 404 days.

(21) Appl. No.: 15/944,920

(22) Filed: Apr. 4, 2018

(65) Prior Publication Data

US 2019/0016906 A1     Jan. 17, 2019

(30) Foreign Application Priority Data

Jul. 14, 2017    (KR) .................. 10-2017-0089674
Mar. 21, 2018   (KR) .................. 10-2018-0032717

(51) Int. Cl.
| | | |
|---|---|---|
| C09D 7/63 | (2018.01) |
| G03F 7/11 | (2006.01) |
| G03F 7/09 | (2006.01) |
| G03F 7/07 | (2006.01) |
| G03F 7/40 | (2006.01) |
| C07F 3/02 | (2006.01) |
| G03F 7/16 | (2006.01) |
| G03F 7/20 | (2006.01) |
| G03F 7/32 | (2006.01) |
| G03F 7/38 | (2006.01) |
| H01L 21/311 | (2006.01) |
| H01L 21/3213 | (2006.01) |
| G03F 7/075 | (2006.01) |

(52) U.S. Cl.
CPC .................. *C09D 7/63* (2018.01); *C07F 3/02* (2013.01); *G03F 7/0752* (2013.01); *G03F 7/094* (2013.01); *G03F 7/11* (2013.01); *G03F 7/162* (2013.01); *G03F 7/168* (2013.01); *G03F 7/2006* (2013.01); *G03F 7/322* (2013.01); *G03F 7/38* (2013.01); *G03F 7/40* (2013.01); *H01L 21/31116* (2013.01); *H01L 21/31144* (2013.01); *H01L 21/32135* (2013.01); *H01L 21/32139* (2013.01)

(58) Field of Classification Search
None
See application file for complete search history.

(56) References Cited

U.S. PATENT DOCUMENTS

| | | |
|---|---|---|
| 4,550,015 A | 10/1985 | Korb et al. |
| 4,679,054 A | 7/1987 | Yoshikawa et al. |
| 5,328,560 A | 7/1994 | Hanawa |
| 5,432,227 A | 7/1995 | Fujimura |
| 6,031,756 A | 2/2000 | Gimzewski |
| 6,120,858 A | 9/2000 | Hirano et al. |
| 7,803,715 B1 | 9/2010 | Haimson et al. |
| 8,008,095 B2 | 8/2011 | Assefa et al. |
| 8,071,485 B2 | 12/2011 | Lee et al. |
| 8,258,346 B2 | 9/2012 | Rajendran |
| 8,524,594 B2 | 9/2013 | Horikoshi |
| 8,871,639 B2 | 10/2014 | Chien et al. |
| 8,999,529 B2 | 4/2015 | Tetsuka et al. |
| 9,018,776 B2 | 4/2015 | Song et al. |

(Continued)

FOREIGN PATENT DOCUMENTS

| | | |
|---|---|---|
| CN | 102774824 A | 11/2012 |
| CN | 102775786 A | 11/2012 |

(Continued)

OTHER PUBLICATIONS

Pigment Blue 15:6 Product Data Sheet, Hangzhou Aibai Chem. Co., Ltd. (Copyright 2010-2017), retrieved online: www.xcolorpigment.com/pigment-blue-15-6.html (Year: 2017).*

(Continued)

*Primary Examiner* — Fred M Teskin
(74) *Attorney, Agent, or Firm* — Harness, Dickey & Pierce, P.L.C.

(57) ABSTRACT

Provided are a hardmask composition including a structure represented by Formula 1 and a solvent, a method of forming a pattern using the hardmask composition, and a hardmask formed from the hardmask composition.

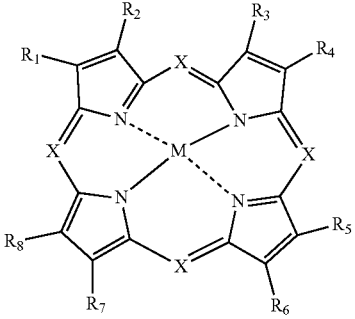

Formula 1 wherein in Formula 1, $R_1$ to $R_8$, X, and M are described in detail in the detailed description.

23 Claims, 10 Drawing Sheets

(56) References Cited

U.S. PATENT DOCUMENTS

| | | |
|---|---|---|
| 9,105,780 B2 | 8/2015 | Jeon et al. |
| 9,410,040 B2 | 8/2016 | Li et al. |
| 9,562,169 B2 | 2/2017 | Wang et al. |
| 9,583,358 B2 | 2/2017 | Kim et al. |
| 9,666,602 B2 | 5/2017 | Lee et al. |
| 9,721,794 B2 | 8/2017 | Shin et al. |
| 9,770,709 B2 | 9/2017 | Swager et al. |
| 2003/0203314 A1 | 10/2003 | Sebald et al. |
| 2005/0112383 A1 | 5/2005 | Tanaka et al. |
| 2005/0238889 A1 | 10/2005 | Iwamoto |
| 2005/0250052 A1 | 11/2005 | Nguyen |
| 2007/0026682 A1 | 2/2007 | Hochberg et al. |
| 2007/0148557 A1 | 6/2007 | Takei et al. |
| 2008/0032176 A1 | 2/2008 | Shimizu et al. |
| 2008/0176741 A1 | 7/2008 | Ma et al. |
| 2009/0011204 A1 | 1/2009 | Wang et al. |
| 2009/0140350 A1 | 6/2009 | Zhu |
| 2009/0297784 A1 | 12/2009 | Xu et al. |
| 2010/0055464 A1 | 3/2010 | Sung |
| 2010/0086463 A1 | 4/2010 | Rudhard et al. |
| 2010/0170418 A1 | 7/2010 | Afzali-Ardakani et al. |
| 2010/0218801 A1 | 9/2010 | Sung et al. |
| 2010/0316950 A1 | 12/2010 | Oguro et al. |
| 2011/0014111 A1 | 1/2011 | Leugers et al. |
| 2011/0210282 A1 | 9/2011 | Foley |
| 2011/0241072 A1 | 10/2011 | Wang et al. |
| 2012/0153115 A1 | 6/2012 | Song et al. |
| 2012/0181507 A1 | 7/2012 | Dimitrakopoulos et al. |
| 2012/0193610 A1 | 8/2012 | Kim |
| 2012/0279570 A1 | 11/2012 | Li et al. |
| 2012/0326391 A1 | 12/2012 | Hirose et al. |
| 2012/0329273 A1 | 12/2012 | Bruce et al. |
| 2013/0011630 A1 | 1/2013 | Sullivan et al. |
| 2013/0119350 A1 | 5/2013 | Dimitrakopoulos et al. |
| 2013/0133925 A1 | 5/2013 | Kim et al. |
| 2013/0200424 A1 | 8/2013 | An et al. |
| 2013/0203198 A1 | 8/2013 | Min et al. |
| 2013/0236715 A1 | 9/2013 | Zhamu et al. |
| 2013/0313523 A1 | 11/2013 | Yun et al. |
| 2014/0015000 A1 | 1/2014 | Nishiyama et al. |
| 2014/0098458 A1 | 4/2014 | Almadhoun et al. |
| 2014/0102624 A1 | 4/2014 | Melamed et al. |
| 2014/0183701 A1 | 7/2014 | Choi et al. |
| 2014/0186777 A1 | 7/2014 | Lee et al. |
| 2014/0187035 A1 | 7/2014 | Posseme et al. |
| 2014/0239462 A1 | 8/2014 | Shamma et al. |
| 2014/0299841 A1 | 10/2014 | Nourbakhsh et al. |
| 2014/0320959 A1 | 10/2014 | Jun et al. |
| 2014/0342273 A1 | 11/2014 | Kim et al. |
| 2015/0001178 A1 | 1/2015 | Song et al. |
| 2015/0004531 A1 | 1/2015 | Choi et al. |
| 2015/0008212 A1 | 1/2015 | Choi et al. |
| 2015/0023858 A1 | 1/2015 | Tour et al. |
| 2015/0030968 A1 | 1/2015 | Schwab et al. |
| 2015/0064904 A1 | 3/2015 | Yao et al. |
| 2015/0129809 A1 | 5/2015 | Gauthy et al. |
| 2015/0137077 A1 | 5/2015 | Yun et al. |
| 2015/0200090 A1 | 7/2015 | Chada et al. |
| 2015/0200091 A1 | 7/2015 | Chada et al. |
| 2015/0348791 A1 | 12/2015 | Higuchi et al. |
| 2015/0348794 A1 | 12/2015 | Kim et al. |
| 2015/0376014 A1 | 12/2015 | Cesareo et al. |
| 2015/0377824 A1 | 12/2015 | Ruhl et al. |
| 2016/0005625 A1 | 1/2016 | Shin et al. |
| 2016/0011511 A1 | 1/2016 | Shin et al. |
| 2016/0027645 A1 | 1/2016 | Shin et al. |
| 2016/0043384 A1 | 2/2016 | Zhamu et al. |
| 2016/0060121 A1 | 3/2016 | Lee et al. |
| 2016/0060122 A1 | 3/2016 | Tour et al. |
| 2016/0130151 A1 | 5/2016 | Kurungot et al. |
| 2016/0152477 A1 | 6/2016 | Xiao et al. |
| 2016/0152748 A1 | 6/2016 | Goffredi et al. |
| 2016/0179005 A1 | 6/2016 | Shamma et al. |
| 2016/0211142 A1 | 7/2016 | Kim et al. |
| 2016/0225991 A1 | 8/2016 | Schwab et al. |
| 2016/0240841 A1 | 8/2016 | He et al. |
| 2016/0282721 A1 | 9/2016 | Seol et al. |
| 2016/0284811 A1 | 9/2016 | Yu et al. |
| 2016/0291472 A1 | 10/2016 | Shin et al. |
| 2016/0308134 A1 | 10/2016 | Li et al. |
| 2016/0346769 A1 | 12/2016 | Kim et al. |
| 2016/0369149 A1 | 12/2016 | Liu et al. |
| 2017/0199454 A1* | 7/2017 | Lee .................. G03F 7/033 |
| 2017/0368535 A1 | 12/2017 | Chopra et al. |
| 2018/0022994 A1 | 1/2018 | Isaji et al. |
| 2018/0047906 A1 | 2/2018 | Begue et al. |
| 2018/0251678 A1 | 9/2018 | Saikia et al. |
| 2019/0031906 A1 | 1/2019 | Kim et al. |
| 2019/0101524 A1 | 4/2019 | Han et al. |
| 2019/0294047 A1 | 9/2019 | Shin et al. |

FOREIGN PATENT DOCUMENTS

| | | |
|---|---|---|
| EP | 1703328 A1 | 9/2006 |
| EP | 2 735 904 A1 | 5/2014 |
| EP | 2950334 A1 | 12/2015 |
| EP | 3 076 239 A1 | 10/2016 |
| JP | H 5-343308 A | 12/1993 |
| JP | 3396846 B2 | 4/2003 |
| JP | 2005-173552 A | 6/2005 |
| JP | 4488234 B2 | 6/2010 |
| JP | 4531400 B2 | 8/2010 |
| JP | 2013-006732 A | 1/2013 |
| JP | 2013-185155 A | 9/2013 |
| JP | 2013208881 A | 10/2013 |
| JP | 2017-036411 A | 2/2017 |
| JP | 2017064714 A | 4/2017 |
| KR | 101057218 B1 | 8/2011 |
| KR | 10-2012-0024756 A | 3/2012 |
| KR | 101257694 B1 | 4/2013 |
| KR | 101262515 B1 | 5/2013 |
| KR | 10-2013-0132103 A | 12/2013 |
| KR | 101343014 B1 | 12/2013 |
| KR | 10-2014-0066524 A | 6/2014 |
| KR | 101423171 B1 | 7/2014 |
| KR | 10-143030 B1 | 9/2014 |
| KR | 10-2015-0047326 A | 5/2015 |
| KR | 10-2016-0012804 A | 2/2016 |
| KR | 20160100172 A | 8/2016 |
| KR | 10-2016-0118782 A | 10/2016 |
| WO | WO-2013/100365 A1 | 7/2013 |
| WO | WO-2014/135455 A1 | 9/2014 |

OTHER PUBLICATIONS

U.S. Office Action dated May 10, 2016 issued in co-pending U.S. Appl. No. 14/791,912.

U.S. Office Action dated Mar. 28, 2016 issued in co-pending U.S. Appl. No. 14/697,150.

Silane Coupling Agents, Xiameter for Dow Corning, Silicones Simplified, pp. 1-7, (2009).

Grenadier, et al. "Dry etching techniques for active devices based on hexagonal boron nitride epilayers," Journal of Vacuum Science & Technology A, vol. 31, pp. 061517-061517.3 (2013).

S. Hascik, et al. "Dry etching of carbon layers in various etch gases," Vacuum, vol. 58, pp. 434-439 (2000).

Albert S. Nazarov, et al. "Functionalization and dispersion of h-BN nanosheets treated with inorganic reagents," Chemistry, An Asian Journal, vol. 7, Issue 3, pp. 1-6, (2012).

U.S. Office Action dated Aug. 16, 2016 issued in co-pending U.S. Appl. No. 14/791,912.

U.S. Office Action dated Sep. 30, 2016 issued in co-pending U.S. Appl. No. 14/697,150.

European Search Report dated Sep. 30, 2015 issued in European Appl. No. 15169702.6.

Zhang, et al. "Fabrication of highly oriented reduced graphene oxide microbelts array for massive production of sensitive ammonia gas sensors", Journal of MicroMechanics and MicroEngineering, vol. 23, pp. 1-8, (2013).

Huang, et al. "An innovative way of etching MoS2: Characterization and mechanistic investigation", Nano Research, vol. 6, No. 3, pp. 200-207, (2013).

(56) References Cited

OTHER PUBLICATIONS

Hwang, et al. "Transparent actuator made with few layer graphene electrode and dielectric elastomer, for variable focus lens", Applied Physics Letters, vol. 103, pp. 023106-1-023106-5, (2013).
U.S. Notice of Allowance dated Jul. 16, 2018 issued in U.S. Appl. No. 14/825,792.
U.S. Notice of Allowance dated Jul. 20, 2018 issued in U.S. Appl. No. 15/611,935.
U.S. Office Action dated Feb. 22, 2018 issued in U.S. Appl. No. 14/825,792.
U.S. Notice of Allowance dated Mar. 27, 2018 issued in U.S. Appl. No. 15/611,935.
U.S. Office Action dated Dec. 5, 2017 issued in U.S. Appl. No. 15/611,935.
U.S. Notice of Allowance dated Feb. 1, 2018 issued in U.S. Appl. No. 14/791,912.
U.S. Office Action dated Jun. 13, 2017 issued in U.S. Appl. No. 14/791,912.
U.S. Office Action dated Feb. 8, 2017 issued in U.S. Appl. No. 14/791,912.
U.S. Office Actiond dated Oct. 6, 2017 issued in U.S. Appl. No. 14/843,003.
U.S. Notice of Allowance dated Aug. 28, 2017 issued in U.S. Appl. No. 14/791,912.
U.S. Notice of Allowance dated Oct. 19, 2016 issued in U.S. Appl. No. 14/725,390.
U.S. Office Action dated Mar. 22, 2016 issued in U.S. Appl. No. 14/725,390.
U.S. Notice of Allowance dated Mar. 15, 2017 issued in U.S. Appl. No. 14/697,150.
Shin, et al. "Mass Production of Graphene Quantum Dots by One-Pot Synthesis Directly from Graphite in High Yield," small communications, vol. 10, No. 5, pp. 866-870 (2014).
Wang, et al. "Gram-scale synthesis of single-crystalline graphene quantum dots with superior optical properties," Nature Communications, pp. 1-9 (2014).
Song, et al. "Highly Efficient Light-Emitting Diode of Graphene Quantum Dots Fabricated from Graphite Intercalation Compounds," Adv. Optical Mater, pp. 1-8 (2014).
Extended European Search Report dated Aug. 17, 2016 issued in European Application No. 15193939.4.
U.S. Office Action dated May 22, 2018 issued in U.S. Appl. No. 14/843,003.
U.S. Office Action dated Mar. 15, 2019 issued in co-pending U.S. Appl. No. 15/925,034.
Notice of Allowance dated Jun. 10, 2020, issued in corresponding U.S. Appl. No. 15/925,034.
S. Sarkar et al., 'Diels-Alder Chemistry of Graphite and Graphene: Grapene as Diene and Dienophila' *Journal of the American Chemistry Society*, vol. 133, Feb. 2011, pp. 3324-3327.
European Search Report dated Sep. 30, 2015 issued in European Application No. 15169702.6.
Office Action dated Jan. 2, 2020, issued in co-pending U.S. Appl. No. 15/925,034.
Morozan, A. et al., "Catalytic activity of cobalt and iron phthalocyanines or porphyrins supported on different carbon nanotubes towards oxygen reduction reaction," Carbon, vol. 49, No. 14, Jul. 2, 2011, pp. 4839-4847.
Chani, F. et al., "Solubility Properties of Unsubstituted Metal Phthalocyanines in Different Types of Solvents," Journal of Chemical and Engineering Data, vol. 57, No. 2, Jan. 27, 2012, pp. 439-449.
Li, Z. et al., "Superstructured Assembly of Nanocarbons: Fullerenes Nanotubes, and Graphene," Chemical Reviews, vol. 115, No. 15, Jul. 13, 2015, pp. 7046-7117.
Extended European Search Report for EP Appl. No. 18183070.4 dated Nov. 23, 2018.
Office Action dated Jun. 25, 2019, issued in co-pending U.S. Appl. No. 16/036,113.
Office Action dated Sep. 3, 2019, issued in corresponding U.S. Appl. No. 15/925,034.
Notice of Allorance dated Jan. 16, 2020, issued in co-pending U.S. Appl. No. 16/036,113.
U.S. Appl. No. 16/036,113, filed Jul. 16, 2018.
U.S. Appl. No. 15/925,034, filed Mar. 19, 2018.
U.S. Appl. No. 15/332,287, filed Oct. 24, 2016.
Office Action dated Aug. 10, 2018 issued in co-pending U.S. Appl. No. 14/791,912.
Notice of Allowance and Fee(s) Due in co-pending U.S. Appl. No. 15/232,287 dated Aug. 9, 2018.

\* cited by examiner

HARDMASK COMPOSITION, METHOD OF FORMING PATTERN USING HARDMASK COMPOSITION, AND HARDMASK FORMED FROM HARDMASK COMPOSITION

CROSS-REFERENCE TO RELATED APPLICATION

This application claims the benefit of Korean Patent Application Nos. 10-2017-0089674, filed on Jul. 14, 2017, and 10-2018-0032717, filed on Mar. 21, 2018, in the Korean Intellectual Property Office, the disclosure of which is incorporated herein in its entirety by reference.

BACKGROUND

1. Field

The present disclosure relates to a hardmask composition, a method of forming a pattern (and/or electronic device) using the hardmask composition, and a hardmask formed from the hardmask composition.

2. Description of Related Art

The semiconductor industry has developed an ultrafine technique for providing a pattern having a size of several to several tens of nanometers. Such an ultrafine technique benefits from effective lithographic techniques. A typical lithographic technique includes providing a material layer on a semiconductor substrate, coating a photoresist layer on the material layer, exposing and developing the same to provide a photoresist pattern, and etching the material layer using the photoresist pattern as a mask.

In order to minimize or reduce the pattern to be formed, it may be difficult to provide a fine pattern having a desirable profile by only using the typical lithographic technique described above. Accordingly, a layer, called "a hardmask", may be formed between the material layer for etching and the photoresist layer to provide a fine pattern. The hardmask serves as an interlayer that transfers the fine pattern of the photoresist to the material layer through a selective etching process. Thus, so that it may tolerate various types of etching processes, the hardmask layer needs to have chemical resistance, thermal resistance, and etching resistance.

As semiconductor devices have become highly integrated, a height of a material layer has been maintained the same or has increased, but a line-width of the material layer has gradually narrowed. Thus, an aspect ratio of the material layer has increased. Because an etching process may be performed under such conditions, the heights of a photoresist layer and a hardmask pattern also need to be increased. However, there is a limit to the extent to which the heights of a photoresist layer and a hardmask pattern may be increased. In addition, the hardmask pattern may be damaged during the etching process for obtaining a material layer with a narrow line-width, and thus electrical characteristics of the devices may deteriorate.

In this regard, methods have been proposed which use a single layer or multiple layers, in which a plurality of layers of a conductive or insulating material are stacked, as a hardmask, wherein the layer(s) in the single layer or multiple layers can be, for example, a polysilicon layer, a tungsten layer, or a nitride layer. However, the single layer or the multiple layers require a relatively high deposition temperature, and thus physical properties of the material layer may be modified. Therefore, new hardmask materials are being developed.

SUMMARY

Provided is a hardmask composition with improved solubility with respect to a solvent and improved etching resistance.

Provided is a method of forming a pattern using the hardmask composition.

Provided is a hardmask formed from the hardmask composition.

Additional aspects will be set forth in part in the description which follows and, in part, will be apparent from the description, or may be learned by practice of the presented embodiments.

According to some example embodiments of inventive concepts, a hardmask composition may include a solvent and a structure represented by Formula 1:

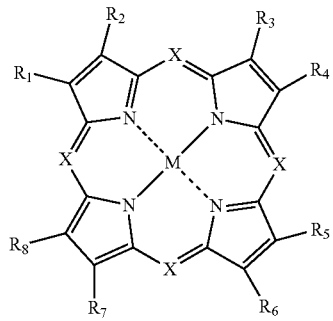

Formula 1 wherein, in Formula 1, X may be $C(R_{11})$ or N, $R_1$ to $R_8$ and $R_{11}$ may each independently include one of a hydrogen, a substituted or unsubstituted $C_1$-$C_{20}$ alkyl group, a substituted or unsubstituted $C_1$-$C_{20}$ alkoxy group, a substituted or unsubstituted $C_2$-$C_{20}$ alkenyl group, a substituted or unsubstituted $C_2$-$C_{20}$ alkynyl group, a substituted or unsubstituted $C_6$-$C_{20}$ aryl group, a substituted or unsubstituted $C_6$-$C_{20}$ aryloxy group, a substituted or unsubstituted $C_2$-$C_{20}$ heteroaryl group, a substituted or unsubstituted $C_2$-$C_{20}$ heteroaryloxy group, a substituted or unsubstituted $C_2$-$C_{20}$ carbocyclic group, a substituted or unsubstituted $C_2$-$C_{20}$ carbocyclic-oxy group, a substituted or unsubstituted $C_2$-$C_{20}$ heterocyclic group, a halogen atom, a cyano group, a hydroxyl group, an imide group, a carbonyl group, an epoxy group, a functional group including an epoxy group, —C(=O)R, —C(=O)NH$_2$, —C(=O)OR, —(CH$_2$)$_n$COOH where n may be an integer from 1 to 10, or —N(R$_9$)(R$_{10}$), or $R_1$ and $R_2$, $R_3$ and $R_4$, $R_5$ and $R_6$, and $R_7$ and $R_8$ may each independently be bound to form a ring, respectively, R may include one of a hydrogen, a $C_1$-$C_{20}$ alkyl group, a $C_2$-$C_{20}$ alkenyl group, a $C_2$-$C_{20}$ alkynyl group, a $C_6$-$C_{20}$ aryl group, a $C_2$-$C_{20}$ heteroaryl group, or a $C_2$-$C_{20}$ heteroaryloxy group, $R_9$ and $R_{10}$ may each independently include one of a hydrogen, a $C_1$-$C_{20}$ alkyl group, a $C_2$-$C_{20}$ alkenyl group, a $C_2$-$C_{20}$ alkynyl group, a $C_6$-$C_{20}$ aryl group, a $C_2$-$C_{20}$ heteroaryl group, or a $C_2$-$C_{20}$ heteroaryloxy group, and M may include an element from one of Groups 2 to 11 and 14, or an oxide thereof.

According to some example embodiments of inventive concepts, a method of forming a pattern may include: forming a layer on a substrate; forming a hardmask on the layer by providing the hardmask composition on the layer and heat-treating the hardmask composition; forming a photoresist layer on the hardmask; forming a hardmask pattern by etching the hardmask using the photoresist layer as an etching mask; and etching the layer using the hardmask pattern as an etching mask.

According to some example embodiments of inventive concepts, a hardmask composition may include at least one of a two-dimensional (2D) carbon nanostructure, a zero-dimensional (0D) carbon nanostructure, a precursor thereof, or a derivative thereof; and a structure represented by Formula 1:

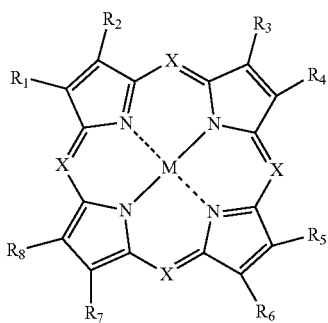

Formula 1 wherein, in Formula 1, X may be $C(R_{11})$ or N, $R_1$ to $R_8$ and $R_{11}$ may each independently include one of a hydrogen, a substituted or unsubstituted $C_1$-$C_{20}$ alkyl group, a substituted or unsubstituted $C_1$-$C_{20}$ alkoxy group, a substituted or unsubstituted $C_2$-$C_{20}$ alkenyl group, a substituted or unsubstituted $C_2$-$C_{20}$ alkynyl group, a substituted or unsubstituted $C_6$-$C_{20}$ aryl group, a substituted or unsubstituted $C_6$-$C_{20}$ aryloxy group, a substituted or unsubstituted $C_2$-$C_{20}$ heteroaryl group, a substituted or unsubstituted $C_2$-$C_{20}$ heteroaryloxy group, a substituted or unsubstituted $C_2$-$C_{20}$ carbocyclic group, a substituted or unsubstituted $C_2$-$C_{20}$ carbocyclic-oxy group, a substituted or unsubstituted $C_2$-$C_{20}$ heterocyclic group, a halogen atom, a cyano group, a hydroxyl group, an imide group, a carbonyl group, an epoxy group, a functional group including an epoxy group, —C(=O)R, —C(=O)NH$_2$, —C(=O)OR, —(CH$_2$)$_n$COOH where n may be an integer from 1 to 10, or —N(R$_9$)(R$_{10}$), or $R_1$ and $R_2$, $R_3$ and $R_4$, $R_5$ and $R_6$, and $R_7$ and $R_8$ may each independently be bound to form a ring, respectively, R may include one of a hydrogen, a $C_1$-$C_{20}$ alkyl group, a $C_2$-$C_{20}$ alkenyl group, a $C_2$-$C_{20}$ alkynyl group, a $C_6$-$C_{20}$ aryl group, a $C_2$-$C_{20}$ heteroaryl group, or a $C_2$-$C_{20}$ heteroaryloxy group, $R_9$ and $R_{10}$ may each independently include one of a hydrogen, a $C_1$-$C_{20}$ alkyl group, a $C_2$-$C_{20}$ alkenyl group, a $C_2$-$C_{20}$ alkynyl group, a $C_6$-$C_{20}$ aryl group, a $C_2$-$C_{20}$ heteroaryl group, or a $C_2$-$C_{20}$ heteroaryloxy group, and M may include an element from one of Groups 2 to 11 and 14.

According to some example embodiments of inventive concepts, the hardmask may include a product of coating and heat-treating of the hardmask composition.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
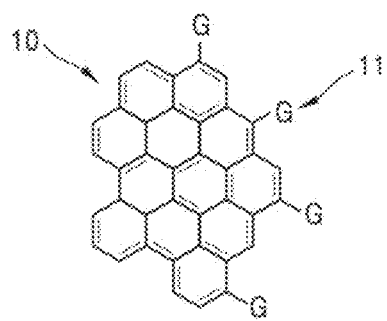
FIG. 1 is a schematic view of an embodiment of a graphene quantum dot (GQD)

Reference will now be made in detail to some example embodiments, which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items.

Hereinafter, a hardmask composition according to one or more example embodiments, a method of forming a pattern using the hardmask composition, and a hardmask formed from the hardmask composition will be described in detail.

A hardmask composition may include a composite including a structure represented by Formula 1:

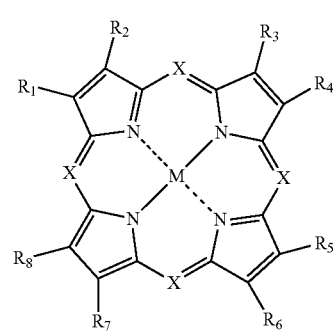

Formula 1 wherein, in Formula 1, X may be $C(R_{11})$ or N, $R_1$ to $R_8$ and $R_{11}$ may each independently include one of (or be selected from) a hydrogen, a substituted or unsubstituted $C_1$-$C_{20}$ alkyl group, a substituted or unsubstituted $C_1$-$C_{20}$ alkoxy group, a substituted or unsubstituted $C_2$-$C_{20}$ alkenyl group, a substituted or unsubstituted $C_2$-$C_{20}$ alkynyl group, a substituted or unsubstituted $C_6$-$C_{20}$ aryl group, a substituted or unsubstituted $C_6$-$C_{20}$ aryloxy group, a substituted or unsubstituted $C_2$-$C_{20}$ heteroaryl group, a substituted or unsubstituted $C_2$-$C_{20}$ heteroaryloxy group, a substituted or unsubstituted $C_2$-$C_{20}$ carbocyclic group, a substituted or unsubstituted $C_2$-$C_{20}$ carbocyclic-oxy group, a substituted or unsubstituted $C_2$-$C_{20}$ heterocyclic group, a halogen atom, a cyano group, a hydroxyl group, an imide group, a carbonyl group, an epoxy group, a functional group containing an epoxy group, —C(=O)R, —C(=O)NH$_2$, —C(=O)OR, —(CH$_2$)$_n$COOH where n may be an integer from 1 to 10, or —N(R$_9$)(R$_{10}$), or R$_1$ and R$_2$, R$_3$ and R$_4$, R$_5$ and R$_6$, and R$_7$ and R$_8$ may each independently be bound to form a ring, respectively, R may include one of (or be selected from) a hydrogen, a $C_1$-$C_{20}$ alkyl group, a $C_2$-$C_{20}$ alkenyl group, a $C_2$-$C_{20}$ alkynyl group, a $C_6$-$C_{20}$ aryl group, a $C_2$-$C_{20}$ heteroaryl group, or a $C_2$-$C_{20}$ heteroaryloxy group, R$_9$ and R$_{10}$ may each independently include one of (or be selected from) a hydrogen, a $C_1$-$C_{20}$ alkyl group, a $C_2$-$C_{20}$ alkenyl group, a $C_2$-$C_{20}$ alkynyl group, a $C_6$-$C_{20}$ aryl group, a $C_2$-$C_{20}$ heteroaryl group, or a $C_2$-$C_{20}$ heteroaryloxy group, and M may include one of (or be selected from) an element of Groups 2 to 11 and 14 of The Periodic Table, or an oxide thereof.

In Formula 1, R$_1$ to R$_8$ may be substituted with various substituents as described above. In the case that R$_1$ to R$_8$ and/or R$_{11}$ are each, for example, a substituted aryl group, or for example, a tert.-butyl phenyl group, the composite including a structure represented by Formula 1 may have improved solubility with respect to organic solvents, such as N-methyl-2-pyrrolidone (NMP), which may facilitate preparation of a hardmask.

In Formula 1, R$_1$ and R$_2$, R$_3$ and R$_4$, R$_5$ and R$_6$, and R$_7$ and R$_8$ may each independently be bound to form a substituted or unsubstituted $C_6$ to $C_{20}$ aromatic ring. Examples of a $C_6$ to $C_{20}$ aromatic ring include a phenyl group.

The composite including a structure represented by Formula 1 may be a composite including a structure represented by Formula 2 or 3:

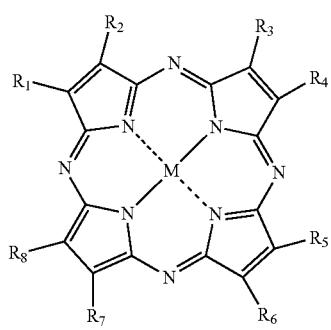

Formula 2 wherein, in Formula 2, M may be at least one of iron (Fe), nickel (Ni), cobalt (Co), manganese (Mn), magnesium (Mg), rhodium (Rh), osmium (Os), ruthenium (Ru), molybdenum (Mo), chromium (Cr), zinc (Zn), titanium (Ti), zirconium (Zr), silicon (Si), or copper (Cu), R$_1$ to R$_8$ may each independently include one of (or be selected from) a hydrogen, a substituted or unsubstituted $C_1$-$C_{20}$ alkyl group, a substituted or unsubstituted $C_1$-$C_{20}$ alkoxy group, a substituted or unsubstituted $C_2$-$C_{20}$ alkenyl group, a substituted or unsubstituted $C_2$-$C_{20}$ alkynyl group, a substituted or unsubstituted $C_6$-$C_{20}$ aryl group, a substituted or unsubstituted $C_6$-$C_{20}$ aryloxy group, a substituted or unsubstituted $C_2$-$C_{20}$ heteroaryl group, a substituted or unsubstituted $C_2$-$C_{20}$ heteroaryloxy group, a substituted or unsubstituted $C_2$-$C_{20}$ carbocyclic group, a substituted or unsubstituted $C_2$-$C_{20}$ carbocyclic-oxy group, a substituted or unsubstituted $C_2$-$C_{20}$ heterocyclic group, a halogen atom, a cyano group, a hydroxyl group, an imide group, a carbonyl group, an epoxy group, a functional group containing an epoxy group, —C(=O)R, —C(=O)NH$_2$, —C(=O)OR, —(CH$_2$)$_n$COOH where n may be an integer from 1 to 10, or —N(R$_9$)(R$_{10}$), or R$_1$ and R$_2$, R$_3$ and R$_4$, R$_5$ and R$_6$, and R$_7$ and R$_8$ may each independently be bound to form a $C_6$-$C_{20}$ aromatic ring, respectively, R may include one of (or be selected from) a hydrogen, a $C_1$-$C_{20}$ alkyl group, a $C_2$-$C_{20}$ alkenyl group, a $C_2$-$C_{20}$ alkynyl group, a $C_6$-$C_{20}$ aryl group, a $C_2$-$C_{20}$ heteroaryl group, or a $C_2$-$C_{20}$ heteroaryloxy group, and R$_9$ and R$_{10}$ may each independently include one of (or be selected from) a hydrogen, a $C_1$-$C_{20}$ alkyl group, a $C_2$-$C_{20}$ alkenyl group, a $C_2$-$C_{20}$ alkynyl group, a $C_6$-$C_{20}$ aryl group, a $C_2$-$C_{20}$ heteroaryl group, or a $C_2$-$C_{20}$ heteroaryloxy group,

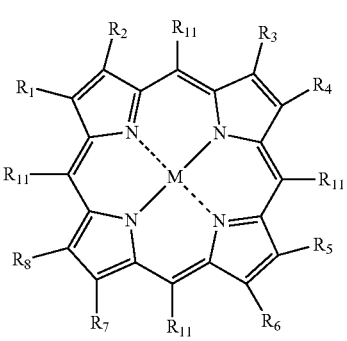

Formula 3 wherein, in Formula 3, M may be at least one of Fe, Ni, Co, Mn, Mg, Rh, Os, Ru, Mo, Cr, Zn, Ti(=O), Zr(=O), Si, or Cu, R$_1$ to R$_8$ may each independently include one of (or be selected from) a hydrogen, a substituted or unsubstituted $C_1$-$C_{20}$ alkyl group, a substituted or unsubstituted $C_1$-$C_{20}$ alkoxy group, a substituted or unsubstituted $C_2$-$C_{20}$ alkenyl group, a substituted or unsubstituted $C_2$-$C_{20}$ alkynyl group, a substituted or unsubstituted $C_6$-$C_{20}$ aryl group, a substituted or unsubstituted $C_6$-$C_{20}$ aryloxy group, a substituted or unsubstituted $C_2$-$C_{20}$ heteroaryl group, a substituted or unsubstituted $C_2$-$C_{20}$ heteroaryloxy group, a substituted or unsubstituted $C_2$-$C_{20}$ carbocyclic group, a substituted or unsubstituted $C_2$-$C_{20}$ carbocyclic-oxy group, a substituted or unsubstituted $C_2$-$C_{20}$ heterocyclic group, a halogen atom, a cyano group, a hydroxyl group, an imide group, a carbonyl group, an, epoxy group, a functional group containing an epoxy group, —C(=O)R, —C(=O)NH$_2$, —C(=O)OR, —(CH$_2$)$_n$COOH where n may be an integer from 1 to 10, or —N(R$_9$)(R$_{10}$), R$_{11}$ may include one of (or be selected from) a hydrogen, a substituted or unsubstituted $C_1$-$C_{20}$ alkyl group, a substituted or unsubstituted $C_6$-$C_{20}$ aryl group, a substituted or unsubstituted $C_6$-$C_{20}$ aryloxy group, a hydroxyl group, a carboxyl group, —C(=O)R, —C(=O)OR, or —N(R$_9$)(R$_{10}$), R may include one of (or be selected from) a hydrogen, a $C_1$-$C_{20}$ alkyl group, a $C_2$-$C_{20}$ alkenyl group, a $C_2$-$C_{20}$ alkynyl group, a $C_6$-$C_{20}$ aryl group, a $C_2$-$C_{20}$ heteroaryl group, or a $C_2$-$C_{20}$ heteroaryloxy group, and $R_9$ and $R_{10}$ may each independently include one of (or be selected from) a hydrogen, a $C_1$-$C_{20}$ alkyl group, a $C_2$-$C_{20}$ alkenyl group, a $C_2$-$C_{20}$ alkynyl group, a $C_6$-$C_{20}$ aryl group, a $C_2$-$C_{20}$ heteroaryl group, or a $C_2$-$C_{20}$ heteroaryloxy group.

In Formula 2, $R_1$ and $R_2$, $R_3$ and $R_4$, $R_5$ and $R_6$, and $R_7$ and $R_8$ may each independently be bound to form a substituted or unsubstituted $C_6$ to $C_{20}$ aromatic ring. Examples of substituents of the substituted $C_6$ to $C_{20}$ aromatic ring include a $C_1$-$C_{20}$ alkyl group, a $C_1$-$C_{20}$ alkoxy group, a $C_6$-$C_{20}$ aryl group, a $C_6$-$C_{20}$ aryloxy group, a $C_2$-$C_{20}$ heteroaryl group, a $C_2$-$C_{20}$ heteroaryloxy group, a hydroxyl group, a carboxyl group, —C(=O)R, —C(=O)OR, —N($R_9$)($R_{10}$), a halogen atom, and a cyano group. R, $R_9$, and $R_{10}$ may be the same as those described with reference to Formula 2.

Since the composite including a structure represented by Formula 2 or 3 has excellent chemical resistance and thermal stability, when this composite is used, it may be possible to prepare a hardmask having improved etching resistance.

The composite including a structure represented by Formula 1 may be, for example, a composite including a structure represented by Formula 4, 4a, 5a, or 5b:

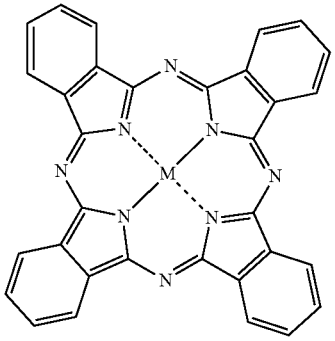

Formula 4 wherein, in Formula 4, M may be at least one of Fe, Ni, Co, Mn, Mg, Rh, Os, Ru, Mo, Cr, Zn, Ti(=O), Zr(=O), Si, or Cu,

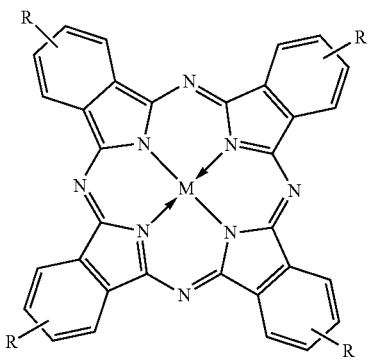

Formula 4a wherein, in Formula 4a, M may be at least one of Fe, Ni, Co, Mn, Mg, Rh, Os, Ru, Mo, Cr, Zn, Ti(=O), Zr(=O), Si, or Cu, and R may be a mono-substituted or multi-substituted substituent that includes one of a $C_1$-$C_{20}$ alkyl group; a $C_1$-$C_{20}$ alkoxy group; a $C_6$-$C_{20}$ aryl group; a $C_6$-$C_{20}$ aryloxy group; a $C_2$-$C_{20}$ heteroaryl group; a $C_2$-$C_{20}$ heteroaryloxy group; a hydroxyl group; —C(=O)OH; —C(=O)$OR_1$, wherein $R_1$ may be a $C_1$-$C_{10}$ alkyl group, a $C_2$-$C_{10}$ alkenyl group, or a $C_6$-$C_{20}$ aryl group; —$NH_2$; —N($R_2$)($R_3$), wherein $R_2$ and $R_3$ may each independently be a $C_1$-$C_{10}$ alkyl group or a $C_6$-$C_{20}$ aryl group; —($CH_2$)$_n$COOH where n is an integer from 1 to 10; —$CONH_2$; a cyano group; or a functional group containing an epoxy group,

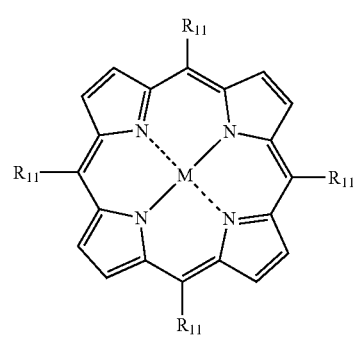

Formula 5a wherein, in Formula 5a, M may be at least one of Fe, Ni, Co, Mn, Mg, Rh, Os, Ru, Mo, Cr, Zn, Ti(=O), Zr(=O), Si, or Cu, and $R_{11}$ may be a substituted $C_6$-$C_{20}$ aryl group, and

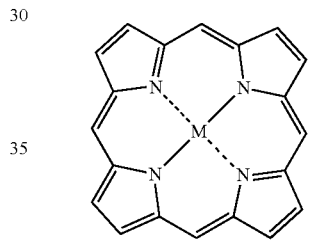

Formula 5b wherein, in Formula 5b, M may be at least one of Fe, Ni, Co, Mn, Mg, Rh, Os, Ru, Mo, Cr, Zn, Ti(=O), Zr(=O), Si, or Cu.

In the compound of Formula 4a, a substituent R is introduced at a phenyl group. Thus, the compound of Formula 4a may have an improved solubility with respect to a solvent, as compared with the compound of Formula 4.

The composite including a structure represented by Formula 1 may be a composite including a structure represented by at least one of Formulae 6a, 7a, or 8a:

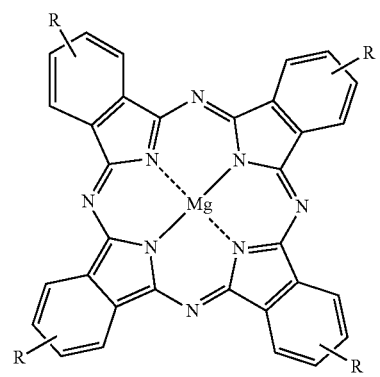

Formula 6a

-continued

Formula 7a
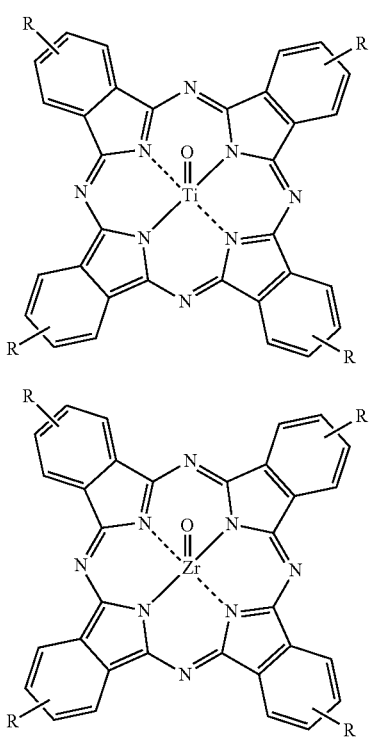

Formula 8a
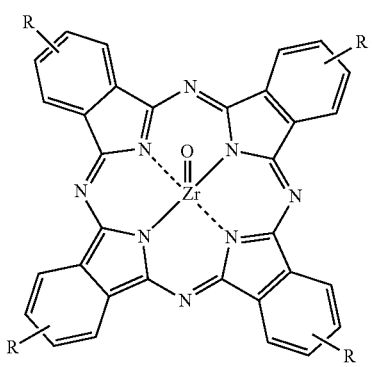

wherein, in Formulae 6a, 7a, and 8a, R may be, for example, a mono-substituted or multi-substituted substituent that includes at least one of a $C_1$-$C_{20}$ alkyl group; a $C_1$-$C_{20}$ alkoxy group; a $C_6$-$C_{20}$ aryl group; a $C_6$-$C_{20}$ aryloxy group; a $C_2$-$C_{20}$ heteroaryl group; a $C_2$-$C_{20}$ heteroaryloxy group; a hydroxyl group; —C(=O)OH; —C(=O)$OR_1$, wherein $R_1$ may be a $C_1$-$C_{10}$ alkyl group, a $C_2$-$C_{10}$ alkenyl group, or a $C_6$-$C_{20}$ aryl group; —$NH_2$; —N($R_2$)($R_3$), wherein $R_2$ and $R_3$ may each independently be a $C_1$-$C_{10}$ alkyl group or a $C_6$-$C_{20}$ aryl group; —$(CH_2)_n$COOH where n is an integer from 1 to 10; —$CONH_2$; a cyano group; or a functional group containing an epoxy group.

In Formulae 6a, 7a, and 8a, a binding site of a substituent R is not particularly limited, and the substituent R may be a mono-substituted substituent or di- to quad-substituted substituent.

The composite including a structure represented by Formula 1 may be, for example, at least one selected from a composite including one or more structures represented by Formulae 6 to 12:

Formula 6
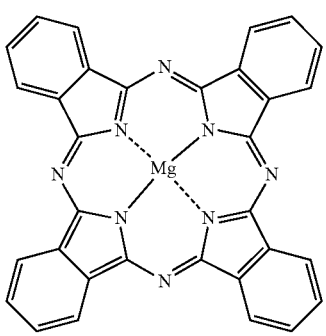

Formula 7
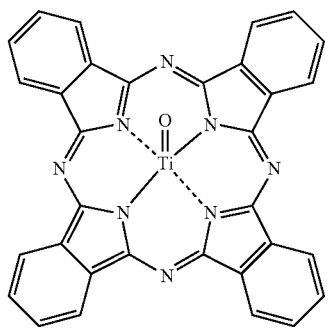

Formula 8
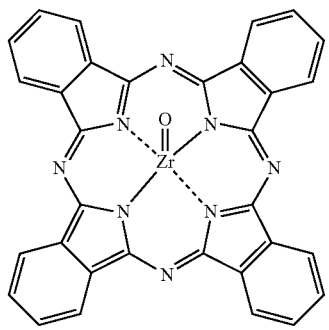

Formula 9
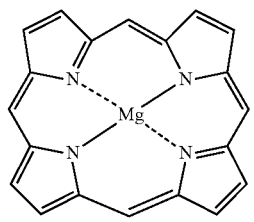

Formula 10
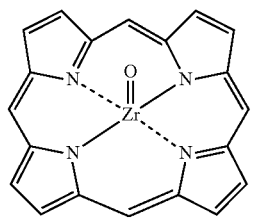

Formula 11
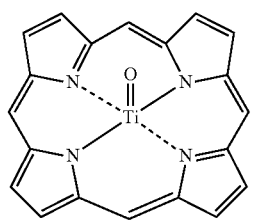

-continued

Formula 12

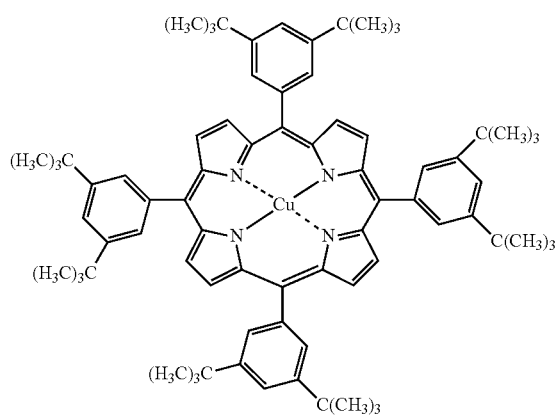

The composite including a structure represented by Formula 12 may have a di-tert.-butyl phenyl group at a position of $R_{11}$. The composite including a structure represented by Formula 12 may have further improved solubility with respect to organic solvents such as NMP, as compared with a composite having hydrogen at a position of $R_{11}$.

The composite including one or more structures of Formulae 3 to 12 may be synthesized according to any suitable method known in the art or commercially available in the art.

In a hardmask composition according to one or more example embodiments, the amount of a composite including a structure represented by Formula 1 may be in a range of about 5 parts to about 50 parts by weight, for example, about 10 parts to about 50 parts by weight, or for example, about 15 parts to 40 parts by weight, based on 100 parts by weight of the hardmask composition. When the amount of the composite is within any of these ranges, the hardmask composition including the composite may have excellent stability, and a hardmask formed using the hardmask composition may have enhanced etching resistance.

A hardmask composition according to one or more embodiments may further include at least one of a two-dimensional (2D) carbon nanostructure, a zero-dimensional (0D) carbon nanostructure, a precursor of the 2D carbon nanostructure, a precursor of the 0D carbon nanostructure, a derivative of the 2D carbon nanostructure, or a derivative of the 0D carbon nanostructure. When the hardmask composition further includes at least one of a 2D carbon nanostructure, a 0D carbon nanostructure, a precursor thereof, or a derivative thereof, the hardmask composition may have improved solubility with respect to a solvent, and thus a formation of a thin film of a hardmask having a uniform thickness may be implemented.

At least one of the 2D carbon nanostructure, the 0D carbon nanostructure, the precursor of the 2D carbon nanostructure, the precursor of the 0D carbon nanostructure, the derivative of the 2D carbon nanostructure, and the derivative of the 0D carbon nanostructure may include at least one functional group selected from a halogen atom, a hydroxyl group, an alkoxy group, a cyano group, an amino group, an azide group, a carboxamidine group, a hydrazino group, a hydrazono group, a carbamoyl group, a thiol group, an ester group, a carboxyl group or a salt thereof, a sulfonic acid group or a salt thereof, and a phosphoric acid group or a salt thereof.

Non-limiting examples of a 0D carbon nanostructure having the foregoing functional groups include a compound represented by Formula 26, or the like.

Example 27

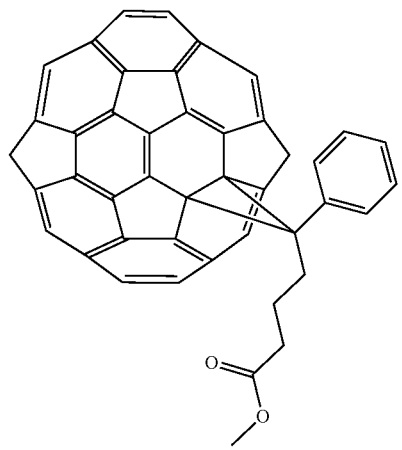 [SMILES: COC(=O)CCCC1(c2ccccc2)C23C4=Cc5ccc6cc7c8c9c(c%10c%11c8c(cc8ccc%12cc(c2c-%10c%12c8%11)C4)C7)C13c5c69]

Depending on the type of a substituent, the solubility of the composite including a structure represented by Formula 1 with respect to a solvent may vary. In some embodiments, the composite including a structure represented by Formula 1 may be mixed with at least one of the 2D carbon nanostructure, the 0D carbon nanostructure, a precursor thereof, or a derivative thereof. In this case, by appropriately adjusting the mixing ratio, the solubility with respect to a solvent may be increased to about 20 percent by weight (wt %) or less, for example, about 1 wt % to about 20 wt %, for example, about 8 wt % to about 20 wt %, or for example, about 10 wt % to about 18 wt %. The 2D carbon nanostructure and the 0D carbon nanostructure may be classified according to the manner in which carbon atoms are connected. The definitions thereof are as follows.

The term "2D carbon nanostructure" as used herein refers to a sheet structure of a single atomic layer formed by a carbon nanostructure that forms polycyclic aromatic molecules in which a plurality of carbon atoms are covalently bound and aligned into a planar shape; a network structure in which a plurality of carbon structures each having a plate shape as a small film piece are interconnected and aligned into a planar shape; or a combination thereof. The covalently bound carbon atoms form repeating units that include 6-membered rings, but may also form 5-membered rings and/or 7-membered rings. The 2D carbon nanostructure may be formed by stacking a plurality of layers including several sheet structures and/or network structures, and an average thickness of the 2D carbon nanostructure may be about 100 nanometers (nm) or less, for example, about 10 nm or less, or in a range of about 0.01 nm to about 10 nm.

The 2D carbon nanostructure may be a graphene nanoparticles (GNP, having a size in a range of about 1 nm to about 50 nm, for example, 1 nm to about 30 nm, or for example, about 5 nm to about 8 nm, and the number of layers of the GNP may be about 300 or less.

The 2D carbon nanostructure may have a 2D sheet form; a ratio of size to thickness thereof may be in a range of about 3 to about 30, for example, about 5 to about 25. When the 2D carbon nanostructure has a plate-like shape, the term "size" denotes a diameter of the 2-dimensional flat shape or a longitudinal length of the 2-dimensional flat shape. When the 2D carbon nanostructure has an oval shape or a non-spherical shape, the term "size" may denote a major axis diameter.

For example, the 2D carbon nanostructure may be at least one of graphene, a graphene nanoparticle, a GQD, reduced graphene oxide, a derivative thereof, or a heteroatom derivative thereof.

The term "precursor of a 2D carbon nanostructure" as used herein refers to a start material for preparing the 2D carbon nanostructure.

The term "0D carbon nanostructure" as used herein may include, for example, fullerenes (C20, and C2n, where n is an integer satisfying the relationship n≥12, such as C26, C28, C36, C50, C60 and C70), boron buckyballs (B80, B90, and B92), carborane ($C_2B_{10}H_{12}$), and a derivative thereof. A particle size of the 0D carbon nanostructure may be in a range of about 0.6 nm to about 2 nm.

The 0D carbon nanostructure may be, for example, fullerene having a particle size of about 1 nm or less, for example, about 0.7 nm to about 1 nm; and a density in a range of about 1.5 grams per cubic centimeter (g/cm$^3$) to about 1.8 g/cm$^3$, for example, about 1.7 g/cm$^3$. All fullerenes have sp$^2$ carbon.

The number of carbon atoms of the 0D carbon nanostructure may be 26 or greater, for example, 60 or greater, for example, 60, 70, 76, 78, 80, 82, or 84.

The term "heteroatom derivative" as used herein refers to a derivative including a heteroatom such as boron B or nitrogen N. The term "precursor of a 0D carbon nanostructure" as used herein refers to a starting material for preparing the 0D carbon nanostructure.

The term "derivative of a 2D carbon nanostructure" as used herein refers to a 2D carbon nanostructure having a reactive functional group. The term "derivative of a 0D carbon nanostructure" as used herein refers to a 0D carbon nanostructure having a reactive functional group. For example, when a 0D carbon nanostructure is fullerene, a derivative of the 0D carbon nanostructure may be fullerene having a reactive functional group such as OH-functionalized fullerene. For example, when a 2D carbon nanostructure is a GQD, a derivative of the 2D carbon nanostructure may be a GQD having a reactive functional group such as COOH-GQD or OH-functionalized GQD.

In a hardmask composition according to one or more embodiments, the composite including a structure represented by Formula 1 may be mixed with at least one of a 2D carbon nanostructure, a 0D carbon nanostructure, a precursor thereof, or a derivative thereof at a weight ratio of about 1:99 to about 99:1, for example, about 1:9 to about 9:1.

In some embodiments, the composite including a structure represented by Formula 1 may be mixed with at least one of a 2D carbon nanostructure or a 0D carbon nanostructure at a weight ratio of about 1:1 to about 1:20, for example, about 1:1 to about 1:10, for example, about 1:2 to about 1:8, or for example, about 1:3 to about 1:5.

The 2D carbon nanostructure may be, for example, a GQD having a size in a range of about 1 nm to about 30 nm, for example, about 1 to about 10 nm. As shown in FIG. 1, the GQD may have, at a terminal(edge) thereof, at least one functional group G of a hydroxyl group, a carbonyl group, a carboxyl group, an epoxy group, an amine group, or an imide group. When a functional group is bound at a terminal(edge) of the GQD as described above, etching resistance of a hardmask formed from the hardmask composition may be better than that of a hardmask in which a functional group is present in the center of the GQD as well as at the terminal(edge) of the GQD.

The 2D carbon nanostructure may be, for example, an OH-functionalized GQD, a COOH-functionalized GQD, or a GQD precursor.

A solvent of the hardmask composition may be any suitable solvent that may dissolve or disperse therein the composite including a structure represented by Formula 1, a 2D carbon nanostructure, a 0D nanostructure, a precursor thereof, and a derivative thereof, or the like. The solvent may include at least one of water, methanol, isopropanol, ethanol, N,N-dimethylformamide, N-methyl-2-pyrrolidone, dichloroethane, dichlorobenzene, dimethylsulfoxide, aniline, propylene glycol, propylene glycol diacetate, methoxypropanediol, diethylene glycol, acetyl acetone, cyclohexanone, γ-butyrolactone, nitromethane, tetrahydrofuran, nitrobenzene, butyl nitrite, methyl cellosolve, ethyl cellosolve, diethyl ether, diethylene glycol methyl ether, diethylene glycol ethyl ether, dipropylene glycol methyl ether, toluene, xylene, hexane, methylethylketone, methyl isobutyl ketone, hydroxymethylcellulose, propylene glycol monomethyl ether acetate (PGMEA), propylene glycol monomethyl ether (PGME), cyclohexanone, ethyl lactate, or heptane.

The amount of the solvent is not particularly limited. For example, the amount of the solvent may be about 100 parts to about 100,000 parts by weight, based on 100 parts by weight of the total weight of the composite including a structure represented by Formula 1. When the amount of the solvent is within this range, the hardmask composition may have an appropriate viscosity and thus may more easily form a layer.

A GQD, which is a type of 2D carbon nanostructures, refers to a semiconductive material in a dot form or sheet form having a size of about 10 nm or less of a graphene, which is a conductive material. A GQD may be, for example, an oxidized GQD and/or a reduced GQD having a size of about 1 nm to about 50 nm, for example, about 1 nm to about 30 nm, or for example, about 1 nm to about 10 nm. When the size of a GQD is within any of these ranges, an etch velocity of the hardmask may be properly controlled, and the dispersibility of the GQD in the hardmask composition may be excellent.

When a GQD is in a spherical form (or dot form), the "size" denotes an average particle diameter of the GQD. When a GQD has a plate-like structure, the term "size" denotes a diameter of the 2-dimensional flat shape. When the GQD has an oval form or a sheet form, the term "size" may denote a major axis diameter or a major axis length.

The size of a GQD may be, for example, in a range of about 1 nm to about 10 nm, for example, about 5 nm to about 8 nm, or for example, about 6 nm to about 8 nm. The number of layers of a GQD may be about 300 or less, or for example, about 100 or less. In some embodiments, the number of layers of the GQD may be in a range of about 1 to about 20. The thickness of a GQD may be about 100 nm or less, for example, about 0.34 nm to about 100 nm. The thickness of a GQD may be, for example, about 10 nm or less, for example, about 0.01 nm to about 10 nm, or for example, about 0.34 nm to about 10 nm.

The GQD may have a 2D sheet form; a ratio of size to thickness thereof may be in a range of about 3 to about 30, for example, about 5 to about 25. When a GQD has a sheet form, the size (the length of the major axis) may be about 1 nm to about 10 nm or less, and the length of the minor axis may be in a range of about 0.5 nm to about 5 nm. When the size, the number of layers, and the thickness of the GQD are within any of these ranges above, the hardmask composition may have improved stability.

A GQD may have, for example, about 100 to about 60,000 conjugated atoms, for example, about 100 to about 600 conjugated atoms.

A COOH-functionalized GQD or an OH-functionalized GQD may be used as a 2D carbon nanostructure.

A COOH-functionalized GQD may be obtained by adding chloroacetic acid to a bare GQD or an OH-functionalized GQD. An OH-functionalized GQD may be obtained by any suitable method of introducing a hydroxyl group to a GQD. The 0D carbon nanostructure can be for example fullerene, such as a functionalized fullerene. For example, the functionalized fullerene may be obtained by grinding fullerene to a selected or given size followed by addition of a base and an oxidizing agent and grinding the mixture. Examples of the base include sodium hydroxide. Examples of the oxidizing agent include hydrogen peroxide.

A hardmask according to one or more embodiments may have improved density and thus may have improved etching resistance, as compared with a conventional hardmask.

A hardmask formed from the hardmask composition according to one or more embodiments may include metal (M) of the composite including a structure represented by Formula 1 and thus may have improved etching resistance and a uniform thickness.

In a hardmask according to one or more example embodiments, light scattering may not occur in a range of visible light, and a transmittance of the hardmask at a wavelength of about 633 nm is about 99% or lower. When a hardmask having improved transmittance as such is used, sensing of a hardmask pattern and an align mark for patterning a layer may become easier, and thus the layer may be patterned at a finer and more compact pattern size.

A GQD contained in the hardmask may have k that is 0.5 or lower, for example, about 0.3 or lower, or in some embodiments, 0.1 or lower, at a wavelength of about 633 nm. For comparison, k of graphite is in a range of about 1.3 to about 1.5, and k of graphene, which is only formed of an $sp^2$ bond structure, is in a range of about 1.1 to about 1.3.

k is an extinction coefficient which is measured using a spectroscopic ellipsometer. When k of a GQD is within the range above, and a hardmask formed using the GQD is used, an align mark may be more easily sensed.

The total thickness of a GQD may be, about 100 nm or less, for example, about 0.34 nm to about 100 nm, or for example, about 0.34 nm to about 10 nm. When a GQD has a thickness as such, the GQD may have a stable structure. A GQD according to one or more example embodiments may include some oxygen atoms in addition to carbon atoms rather than having a complete C=C/C—C conjugated structure. Also, a carboxyl group, a hydroxyl group, an epoxy group, or a carbonyl group may be bound at the terminal (edge) of a GQD.

The GQD may have improved solvent dispersibility, and thus, manufacture of a hardmask composition with improved stability is convenient. Also, the GQD may improve etching resistance against an etching gas.

The GQD according to one or more example embodiments may have peaks observed at about 1,340 centimeters$^{-1}$ (cm$^{-1}$) to about 1,350 cm$^{-1}$, about 1,580 cm$^{-1}$, and about 2,700 cm$^{-1}$ in Raman spectroscopy analysis. These peaks provide information of the thickness, crystallinity, and charge doping status of the GQD. The peak observed at about 1,580 cm$^{-1}$ is a "G mode" peak, which is generated by a vibration mode corresponding to stretching of a carbon-carbon bond. Energy of the "G mode" is determined by a density of excess charge doped in the GQD. Also, the peak observed at about 2,700 cm$^{-1}$ is a "2D mode" peak that is useful in the evaluation of the thickness of the GQD. The peak observed at about 1,340 cm$^{-1}$ to about 1,350 cm$^{-1}$ is a "D mode" peak, which appears when an $sp^2$ crystal structure has defects and is mainly observed when many defects are found around edges of a sample or in the sample per se. Also, a ratio of a D peak intensity to a G peak intensity (a D/G intensity ratio) provides information of a degree of disorder of crystals of the GQD.

An intensity ratio ($I_D/I_G$) of a D mode peak to a G mode peak obtained from Raman spectroscopy analysis of the GQD is 2 or lower, for example, in a range of about 0.001 to about 2.0.

An intensity ratio ($I_{2D}/I_G$) of a 2D mode peak to a G mode peak obtained from Raman spectroscopy analysis of the GQD is 0.01 or higher. For example, the intensity ratio ($I_{2D}/I_G$) may be within a range of about 0.01 to about 1.0, or about 0.05 to about 0.5. When the intensity ratio of a D mode peak to a G mode peak and the intensity ratio of a 2D mode peak to a G mode peak are within any of these ranges, the GQD may have a relatively high crystallinity and a relatively small defect, and thus a bonding energy increases so that a hardmask formed using the GQD may have desirable etching resistance.

X-ray diffraction analysis using CuKα is performed on the GQD and as a result of the X-ray diffraction analysis, the GQD may include a 2D layered structure having a (002) crystal face peak. The (002) crystal face peak may be observed within a range of about 20° to about 27°.

An interlayer distance (d-spacing) of the GQD obtained from the X-ray diffraction analysis may be in a range of about 0.3 nm to about 0.7 nm, for example, about 0.334 nm to about 0.478 nm. When the interlayer distance (d-spacing) is within this range, the hardmask form from the hardmask composition may have desirable etching resistance.

The GQD according to one or more example embodiments has a higher content of $sp^2$ carbon than that of $sp^3$ carbon and a relatively high content of oxygen, as compared with a conventional amorphous carbon layer. An $sp^2$ carbon bond, e.g., a bond of an aromatic structure, has a higher bonding energy than that of an $sp^3$ carbon bond.

The $sp^3$ structure is a 3-dimensional (3D) bonding structure of diamond-like carbon in a tetrahedral shape. The $sp^2$ structure is a 2D bonding structure of graphite in which a carbon to hydrogen ratio (a C/H ratio) increases and thus may secure resistance to dry etching.

In the GQD, an $sp^2$ carbon fraction may be equal to or a multiple of an $sp^3$ carbon fraction. For example, an $sp^2$ carbon fraction may be a multiple of an $sp^3$ carbon fraction by about 1.0 to about 10, or by about 1.88 to 3.42.

An amount of the $sp^2$ carbon atom bonding structure is about 30 atom % or greater, for example, about 39.7 atom % to about 62.5 atom %, in a C1s XPS analysis. Due to the mixing ratio, bond breakage of the GQD may be difficult because carbon-carbon bond energy is relatively high. Thus, when a hardmask composition including the GQD is used, etching resistance characteristics during the etching process may improve. A bond strength between the hardmask and adjacent layers may also increase.

A hardmask obtained using conventional amorphous carbon mainly includes an $sp^2$-centered carbon atom bonding structure and thus may have desirable etching resistance and relatively low transparency. Therefore, when the hardmasks are aligned, problems may occur, and particles may be generated during a deposition process, and thus a hardmask formed using a diamond-like carbon having an $sp^3$-carbon atom bonding structure has been developed. However, the hardmask has relatively low etching resistance and thus has a limit in process application.

A k value of graphite is in a range of about 1.3 to about 1.5, and a k value of graphene having a $sp^2$ structure is in a range of about 1.1 to about 1.3. A GQD according to one or more example embodiments has a k value that is 1.0 or lower, for example, in a range of about 0.1 to about 0.5 at a selected or given wavelength. Thus the GQD has improved transparency. Thus, when a hardmask including the GQD is used, an align mark may be more easily sensed during formation of a pattern of a layer. Therefore, the pattern may be more finely and evenly formed, and the hardmask may have desirable etching resistance.

In a hardmask obtained using a hardmask composition according to one or more example embodiments, organic matters and additives are mixed together, and thus, the hardmask may be easily removed by using a general metal hardmask. Accordingly, patterning of the hardmask may become easier.

The hardmask composition may further include a first material selected from a monomer containing an aromatic ring and a polymer including a repeating unit containing the monomer; at least one second material selected from a hexagonal boron nitride derivative, a metal chalcogenide-based material, and their precursors; or a mixture of the first material and the second material.

The first material may not be combined with the second material, or the first material may be combined to the second material by a chemical bond. The first material and the second material combined by a chemical bond may form a composite structure. The first material and the second material having the aforementioned functional groups may be bound through a chemical bond.

The chemical bond may be, for example, a covalent bond. The covalent bond may include at least one of an ester group (—C(=O)O—), an ether group (—O—), a thioether group (—S—), a carbonyl group ((—C)=O)—), or an amide group (—C(=O)NH—).

The first material and the second material may include at least one of (or selected from the group consisting of) a hydroxyl group, a carboxyl group, an amino group, —Si(R$_1$)(R$_2$)(R$_3$) (wherein each of R$_1$, R$_2$, and R$_3$ are independently one of hydrogen, a hydroxyl group, a C$_1$-C$_{30}$ alkyl group, a C$_1$-C$_{30}$ alkoxy group, a C$_6$-C$_{30}$ aryl group, a C$_6$-C$_{30}$ aryloxy group, or a halogen atom), a thiol group (—SH), —Cl, —C(=O)Cl, —SCH$_3$, a halogen atom, an isocyanate group, a glycidyloxy group, an aldehyde group, an epoxy group, an imino group, a urethane group, an ester group, an amide group, an imide group, an acryl group, a methacryl group, —(CH$_2$)$_n$COOH (wherein n is an integer from 1 to 10), —CONH$_2$, a C$_1$-C$_{30}$ saturated organic group having a photosensitive functional group, or a C$_1$-C$_{30}$ unsaturated organic group having a photosensitive functional group.

The monomer containing an aromatic ring may be, for example, a monomer represented by at least one of the structures in Formula 13:

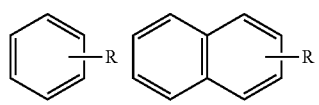

Formula 13

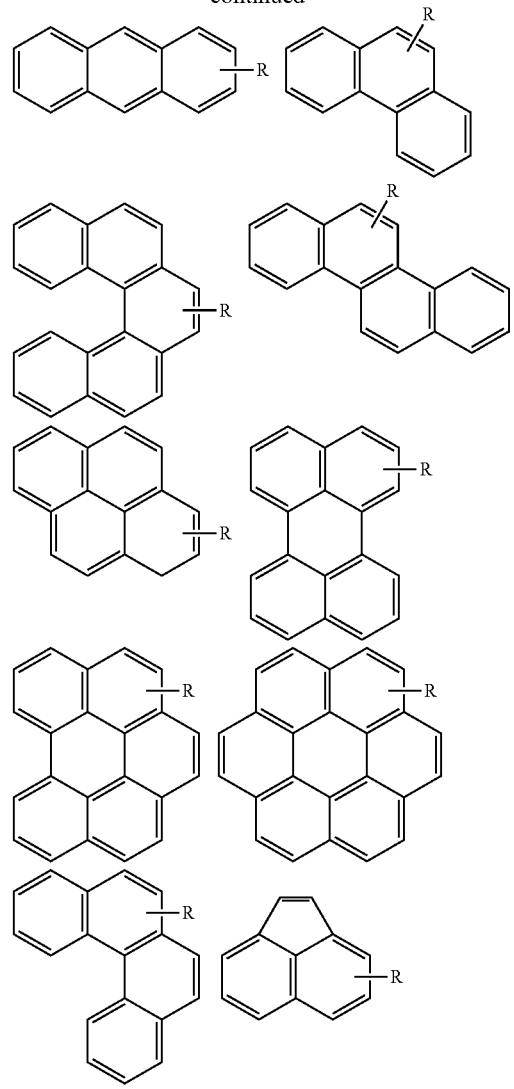

-continued wherein, in Formula 13, R is hydrogen or a mono-substituted or a multi-substituted substituent that is at least one of a halogen atom, a hydroxyl group, an isocyanate group, a glycidyloxy group, a carboxyl group, an aldehyde group, an amino group, a siloxane group, an epoxy group, an imino group, a urethane group, an ester group, an epoxy group, an amide group, an imide group, an acryl group, a methacryl group, a substituted or unsubstituted C$_1$-C$_{30}$ saturated organic group, or a substituted or unsubstituted C$_1$-C$_{30}$ unsaturated organic group.

R may be a general photosensitive functional group as well as the foregoing groups.

The C$_1$-C$_{30}$ saturated organic group and the C$_1$-C$_{30}$ unsaturated organic group may have a photosensitive functional group. Examples of the photosensitive functional group include an epoxy group, an amide group, an imide group, a urethane group, and an aldehyde group.

Examples of the C$_1$-C$_{30}$ saturated organic group and the C$_1$-C$_{30}$ unsaturated organic group include a substituted or unsubstituted C$_1$-C$_{30}$ alkyl group, a substituted or unsubstituted C$_1$-C$_{30}$ alkoxy group, a substituted or unsubstituted C$_2$-C$_{30}$ alkenyl group, a substituted or unsubstituted C$_2$-C$_{30}$ alkynyl group, a substituted or unsubstituted C$_6$-C$_{30}$ aryl group, a substituted or unsubstituted $C_6$-$C_{30}$ aryloxy group, a substituted or unsubstituted $C_2$-$C_{30}$ heteroaryl group, a substituted or unsubstituted $C_2$-$C_{30}$ heteroaryloxy group, a substituted or unsubstituted $C_4$-$C_{30}$ carbocyclic group, a substituted or unsubstituted $C_4$-$C_{30}$ carbocyclic-oxy group, or a substituted or unsubstituted $C_2$-$C_{30}$ heterocyclic group.

In Formula 13, a binding site of R is not limited. Although only one R is shown in Formula 13 for convenience of description, R may be substituted at any site where substitution is possible.

The monomer containing an aromatic ring may be, for example, a monomer represented by Formula 14:

A-L-A'  Formula 14 wherein, in Formula 14, A and A' may be identical to or different from each other and may each be a monovalent organic group derived from a monomer of the monomers represented by Formula 13; and L may be a linker which represents a single bond or is selected from a substituted or unsubstituted $C_1$-$C_{30}$ alkylene group, a substituted or unsubstituted $C_2$-$C_{30}$ alkenylene group, a substituted or unsubstituted $C_2$-$C_{30}$ alkynylene group, a substituted or unsubstituted $C_7$-$C_{30}$ arylene-alkylene group, a substituted or unsubstituted $C_6$-$C_{30}$ arylene group, a substituted or unsubstituted $C_2$-$C_{30}$ heteroarylene group, a substituted or unsubstituted $C_3$-$C_{30}$ heteroarylene-alkylene group, a substituted or unsubstituted $C_1$-$C_{30}$ alkylene-oxy group, a substituted or unsubstituted $C_7$-$C_{30}$ arylenealkyleneoxy group, a substituted or unsubstituted $C_6$-$C_{30}$ aryleneoxy group, a substituted or unsubstituted $C_2$-$C_{30}$ heteroaryleneoxy group, a substituted or unsubstituted $C_3$-$C_{30}$ heteroarylene-alkylene-oxy group, —C(=O)—, and —SO$_2$—.

In L, the substituted $C_1$-$C_{30}$ alkylene group, the substituted $C_2$-$C_{30}$ alkenylene group, the substituted $C_2$-$C_{30}$ alkynylene group, the substituted $C_7$-$C_{30}$ arylene-alkylene group, the substituted $C_6$-$C_{30}$ arylene group, the substituted $C_2$-$C_{30}$ heteroarylene group, the substituted $C_2$-$C_{30}$ heteroarylene-alkylene group, the substituted $C_1$-$C_{30}$ alkylene-oxy group, the substituted $C_7$-$C_{30}$ arylenealkyleneoxy group, the substituted $C_6$-$C_{30}$ aryleneoxy group, the substituted $C_2$-$C_{30}$ heteroaryleneoxy group, and the substituted $C_2$-$C_{30}$ heteroarylene-alkylene-oxy group may each be substituted with at least one substituent selected from a halogen atom, a hydroxyl group, an isocyanate group, a glycidyloxy group, a carboxyl group, an aldehyde group, an amino group, a siloxane group, an epoxy group, an imino group, a urethane group, an ester group, an amide group, an imide group, an acryl group, and a methacryl group, or may be substituted with a photosensitive functional group.

The first material may include at least one of a compound represented by Formula 15 or a compound represented by Formula 16:

Formula 15

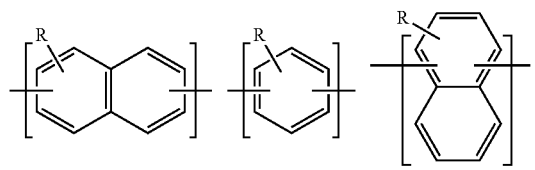

wherein, in Formula 15, R may be the same as described with reference to Formula 13, and Formula 16

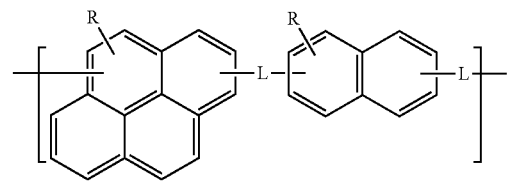

wherein, in Formula 16, R is the same as described with reference to Formula 13, and L is the same as described with reference to Formula 14.

In Formulae 15 and 16, a binding site of R is not limited. Although only one R is shown in Formulae 15 and 16 for convenience of description, R may be substituted at any site where substitution is possible.

A weight average molecular weight of the polymer containing a repeating unit including a monomer containing an aromatic ring may be about 300 to about 30,000 g/mol. When the polymer having a weight average molecular weight within this range is used, a thin film may be more easily formed, and a transparent hardmask may be manufactured.

In one or more example embodiments, the first material may be a compound represented by Formula 17:

Formula 17

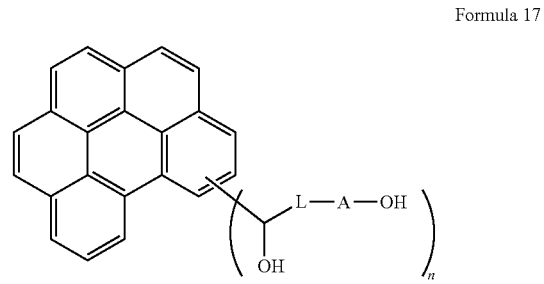

wherein, in Formula 17, A may be a substituted or unsubstituted $C_6$-$C_{30}$ arylene group, and L may be a single bond or a substituted or unsubstituted $C_1$-$C_6$ alkylene group, and n may be an integer from 1 to 5.

The arylene group may include one of (or be selected from) a structure in Group 1:

Group 1

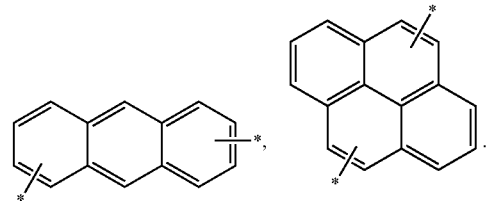

The compound of Formula 17 may be represented by one of Formulae 17a or 17b:
Formula 17a
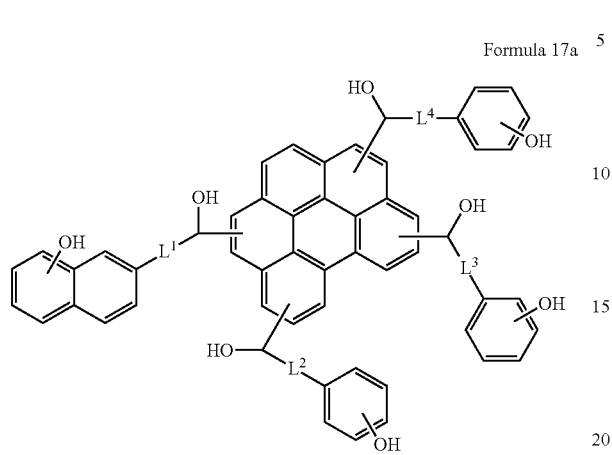
Formula 17b
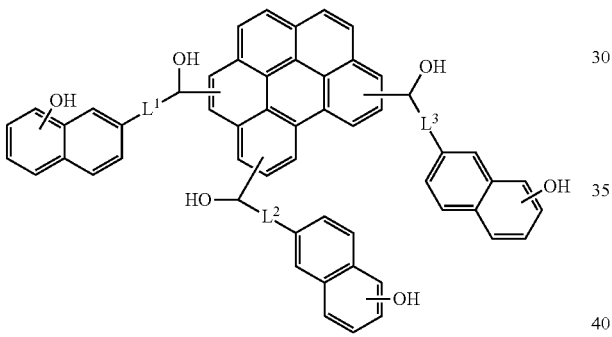
wherein, in Formulae 17a, 17b, and 17c, $L^1$ to $L^4$ may each independently be a single bond or a substituted or unsubstituted $C_1$-$C_6$ alkylene group.
The first material may include one of (or be selected from) the compounds represented by Formulae 17c to 17e:
Formula 17c
Formula 17d
Formula 17e The first material may be a compounds represented by Formula 18:

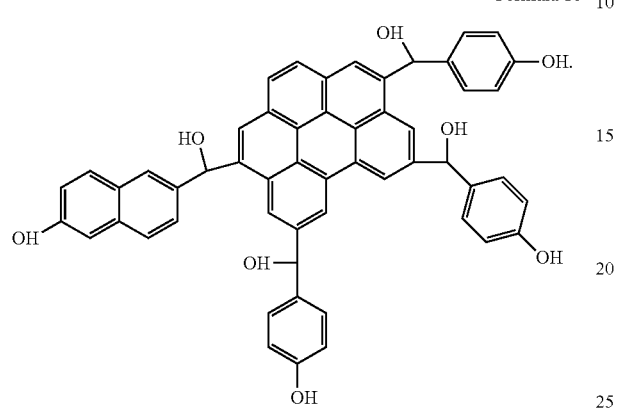

Formula 18

The first material may be a copolymer represented by Formula 19:

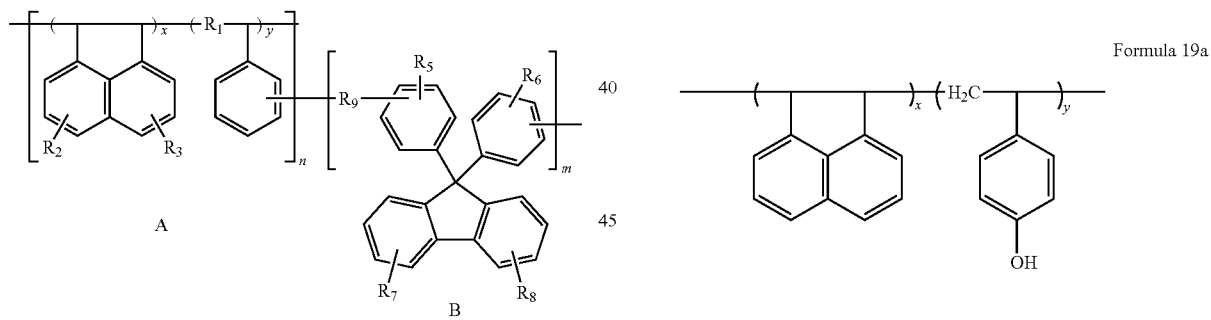

Formula 19 wherein, in Formula 19, $R_1$ may be a $C_1$-$C_4$ substituted or unsubstituted alkylene; $R_2$, $R_3$, $R_7$, and $R_8$ may each independently be hydrogen, a hydroxy group, a $C_1$-$C_{10}$ linear or branched alkyl group, a $C_1$-$C_{10}$ alkoxy group, or a $C_6$-$C_{30}$ aryl group; $R_4$, $R_5$, and $R_6$ may each independently be hydrogen, a hydroxy group, a $C_1$-$C_4$ alkoxy group, or a $C_2$-$C_{30}$ alkylphenyldialkylene ether group; and $R_9$ may be an alkylene group, a $C_2$-$C_{30}$ alkylenephenyl $C_2$-$C_{30}$ alkylene group, a hydroxyphenyl $C_2$-$C_{30}$ alkylene group, or a mixture thereof, wherein x and y may each independently be a mole fraction of two repeating units in part A which is about 0 to about 1, where x+y=1; n may be an integer from 1 to 200; and m may be an integer from 1 to 200.

The first material may be represented by Formula 19a, or 19b:

Formula 19a wherein, in Formula 19a, x may be 0.2, and y may be 0.8,

Formula 19b

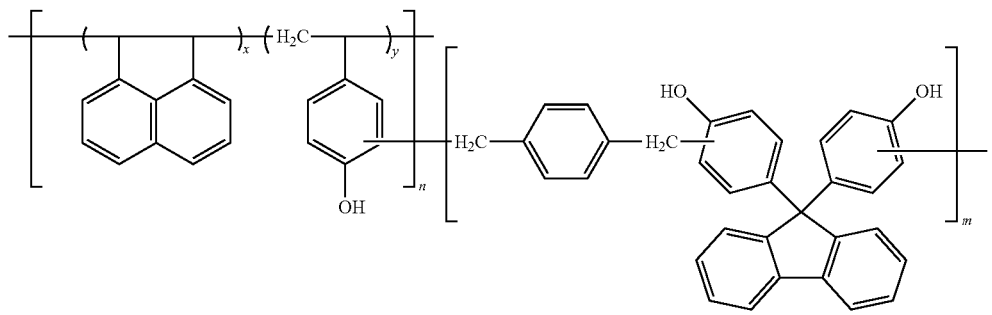

wherein, in Formula 19b, x may be 0.2, y may be 0.8, n=90, and m=10, and

The first material may be a copolymer represented by Formula 20 or 21:

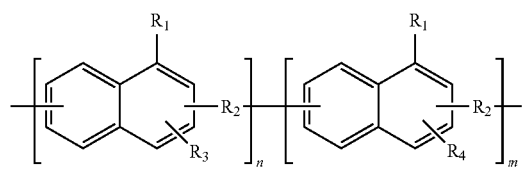

Formula 20

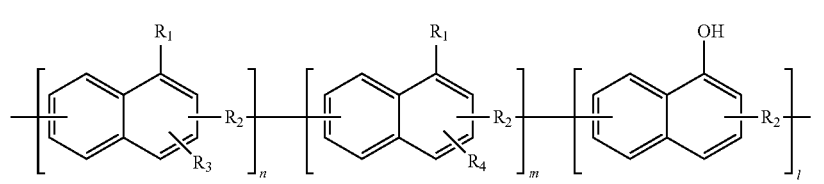

Formula 21 wherein, in Formulae 20 and 21, m and n may each be an integer from 1 to 190, $R_1$ may be one of hydrogen (—H), a hydroxy group (—OH), a $C_1$-$C_{10}$ alkyl group, a $C_6$-$C_{10}$ aryl group, an allyl group, and a halogen atom, $R_2$ may be one of a group represented by Formula 22, a phenylene group, a chrysenylene group, a pyrenylene group, a fluoroanthenylene group, an anthronylene group, a benzophenone group, a thioxanthonylene group, an anthracenylene group, and their derivatives; $R_3$ may be a conjugated diene group; and $R_4$ may be an unsaturated dienophile group.

Formula 22

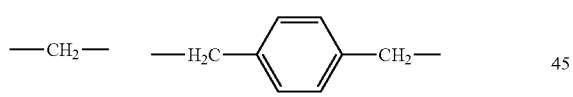

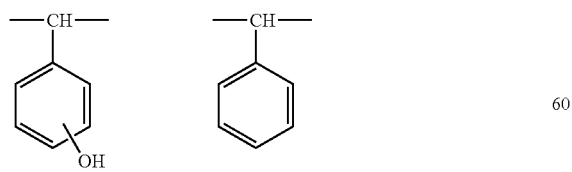

wherein, in Formulae 20 and 21, $R_3$ may be a 1,3-butadienyl group, or a 1,2,4-cyclopentadienylmethyl group, and $R_4$ may be a vinyl group or a cyclopentenylmethyl group.

The first material may be a polymer represented by one of Formulae 23 to 26.

Formula 23

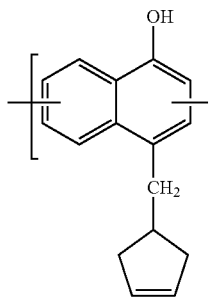

wherein, in Formula 23, m+n=21, a weight average molecular weight thereof may be about 10,000 g/mol, and a polydispersity thereof may be 2.1, Formula 24

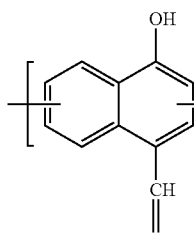

wherein, in Formula 24, a weight average molecular weight thereof may be about 11,000, and a polydispersity thereof may be 2.1, Formula 25

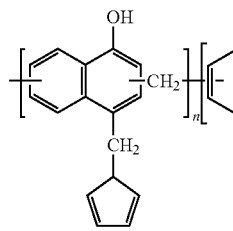

wherein, in Formula 25, a weight average molecular weight thereof may be about 10,000 g/mol, a polydispersity thereof may be 1.9, l+m+n=21, and n+m:l=2:1, and Formula 26

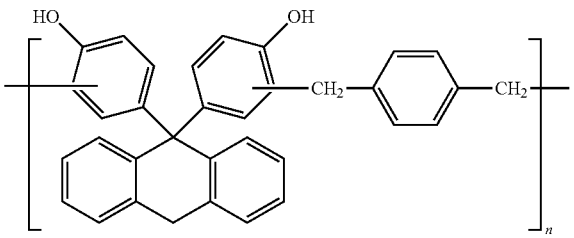

wherein, in Formula 26, a weight average molecular weight thereof may be about 10,000, a polydispersity thereof may be about 2.0, and n may be about 20.

In a hardmask composition according to one or more example embodiments, materials for forming a hardmask, e.g., the complex including a structure represented by Formula 1 and the optional 2D carbon nanostructure have a relatively low reactivity with respect to a CxFy gas, which is an etching gas used to perform etching on a material layer such as $SiO_2$ or $SiN_x$, and thus the etching resistance of the hardmask formed from the hardmask composition may increase. When an etching gas with a relatively low reactivity with respect to $SiO_2$ or $SiN_x$, such as $SF_6$ or $XeF_6$, is used, etching may be more easily performed on the materials, and thus ashing may be more easily performed thereon as well. Moreover, the materials for forming a hardmask are a transparent material having a band gap, and thus the preparation process may be more easily carried out because an additional align mark may not be necessary.

The hexagonal boron nitride derivative is a hexagonal boron nitride (h-BN) or a hexagonal boron carbonitride (h-BxCyNz) (wherein the sum of x, y, and z may be 3). In the hexagonal boron nitride derivative, boron and nitrogen atoms may be regularly included in a hexagonal ring, or some of boron and nitrogen atoms may be substituted with carbon atoms while maintaining the hexagonal ring.

The metal chalcogenide-based material is a compound including at least one Group 16 (chalcogen) element and at least one electropositive element. For example, the metal chalcogenide-based material may include one or more of molybdenum (Mo), tungsten (W), niobium (Nb), vanadium (V), tantalum (Ta), titanium (Ti), zirconium (Zr), hafnium (Hf), technetium (Tc), rhenium (Re), copper (Cu), gallium (Ga), indium (In), tin (Sn), germanium (Ge), and lead (Pb) and one chalcogen element selected from sulfur (S), selenium (Se), or tellurium (Te).

The metal chalcogenide-based material may include one of (or be selected from) a molybdenum sulfide ($MoS_2$), molybdenum selenide ($MoSe_2$), molybdenum telluride ($MoTe_2$), tungsten sulfide ($WS_2$), tungsten selenide ($WSe_2$), and tungsten telluride ($WTe_2$). In some embodiments, the metal chalcogenide-based material may be molybdenum sulfide ($MoS_2$).

The hexagonal boron nitride has a flat hexagonal crystal structure, the vertices of which are occupied alternately by boron and nitrogen atoms. A layered structure of the hexagonal boron nitride is a structure in which a boron atom and a nitrogen atom neighboring each other overlap due to their polarities, and this structure is also referred as "an AB stacking". The hexagonal boron nitride may have a layered structure, in which nanolevel-thin sheets are stacked in layers, and this layered structure may be separated or detached from each other to form a single layer or multiple layers of a hexagonal boron nitride sheet.

The hexagonal boron nitride derivative according to one or more example embodiments may have a peak observed at about 1,360 cm$^{-1}$ in Raman spectroscopy analysis. This location of the peak may reveal the number of layers in the hexagonal boron nitride. Through atomic force microscopic (AFM) analysis, Raman spectroscopy analysis, and transmission electron microscope (TEM) analysis performed on the hexagonal boron nitride, it may be found that the hexagonal boron nitride has a nanosheet structure.

X-ray diffraction analysis using CuKα is performed on the hexagonal boron nitride derivative, and as a result of the X-ray diffraction analysis, the hexagonal boron nitride derivative may include a 2D layered structure having a (002) crystal face peak. The (002) crystal face peak may be observed within a range of about 20° to about 27°.

An interlayer distance (d-spacing) of the hexagonal boron nitride derivative obtained from the X-ray diffraction analysis may be in a range of about 0.3 nm to about 0.7 nm, for example, about 0.334 nm to about 0.478 nm. An average particle diameter of the hexagonal boron nitride crystals obtained from the X-ray diffraction analysis may be about 1 nm or greater, for example, in a range of about 23.7 Angstroms (Å) to about 43.9 Å. When the interlayer distance (d-spacing) is within this range, the hardmask formed from the hardmask composition may have desirable etching resistance.

The hexagonal boron nitride derivative may be formed as a single layer of 2D boron nitride derivative, or formed by stacking multiple layers of 2D boron nitride.

Hereinafter, a method of preparing a hardmask using a hardmask composition according to one or more embodiments and a method of forming a pattern using the hardmask composition will further be described.

In some embodiments, a hardmask composition may include a composite including a structure represented by Formula 1 and a solvent. In some embodiments, a hardmask composition may include the composite including a structure represented by Formula 1, at least one selected from a 2D carbon nanostructure, a 0D carbon nanostructure, a precursor thereof, and a derivative thereof, and a solvent.

The hardmask composition may further include a first material selected from a monomer containing an aromatic ring and a polymer including a repeating unit containing the monomer; at least one second material selected from a hexagonal boron nitride derivative, a metal chalcogenide-based material, and their precursors; or a mixture of the first material and the second material.

A layer may be formed on a substrate. Then, the layer may be coated with the hardmask composition and then dried, thereby forming a hardmask.

The hardmask prepared as described above may have a thickness in a range of about 10 nm to about 10,000 nm. Such a hardmask may include a product of coating and heat-treating of the hardmask composition.

A hardmask according to one or more example embodiments may include the composite including a structure represented by Formula 1.

A hardmask according to one or more example embodiments may include the composite including a structure represented by Formula 1, and at least one selected from a 2D carbon nanostructure, a 0D carbon nanostructure, and a derivative thereof.

A hardmask according to one or more example embodiments may include i) the composite including a structure represented by Formula 1; ii) at least one first material selected from a monomer containing an aromatic ring and a polymer including a repeating unit containing the monomer; at least one second material selected from a hexagonal boron nitride derivative, a metal chalcogenide-based material, and their precursors; or a mixture of the first material and the second material.

A hardmask according to one or more example embodiments may include i) the composite including a structure represented by Formula 1; ii) at least one selected from a 2D carbon nanostructure, a 0D carbon nanostructure, and a derivative thereof; and iii) at least one first material selected from a monomer containing an aromatic ring and a polymer including a repeating unit containing the monomer; at least one second material selected from a hexagonal boron nitride derivative, a metal chalcogenide-based material, and their precursors; or a mixture thereof.

During or after the coating the layer with the hardmask composition, heat treatment may be performed on the hardmask composition. In some embodiments, this heat treatment may be omitted. This heat treatment may differ depending on a material of the layer. For example, the heat treatment may be performed at a temperature of about 1,000° C. or less, for example, in a range of about 50° C. to about 1,000° C., or for example, about 300° C. to about 1,000° C.

The heat treatment may be performed in an inert gas atmosphere or in vacuum.

A heating source of the heat treatment may be induction heating, radiant heat, lasers, infrared rays, microwaves, plasma, ultraviolet rays, or surface plasmon heating.

The inert gas atmosphere may be a nitrogen gas and/or an argon gas, or a mixture thereof.

After the heat treatment, the solvent may be removed. Subsequently, c-axis alignment of graphene may be performed.

Whether or not the heat treatment has been carried out, the resultant from which the solvent has been removed may be baked at a temperature of about 400° C. or lower, for example, about 100° C. to about 400° C. Then, another heat treatment may be further performed on the baked resultant at a temperature of about 800° C. or lower, for example, in a range of about 400 to 800° C.

A thermal reduction process may proceed during the heat treatment. In some embodiments, the baking process may not be performed, and the heat treatment may only be performed. When the temperatures of the heat treatment and the baking process are within any of these ranges, the prepared hardmask may have desirable etching resistance.

A temperature increasing rate in the heat treatment and the baking process may be about 1° C./min to about 10° C./min. When a temperature increasing rate is within this range, the deposited layer may not be damaged due to a rapid temperature change, and thus process efficiency may be desirable.

A thickness of the hardmask may be, for example, in a range of about 10 nm to about 10,000 nm.

When the hardmask composition includes a GQD as a 2D carbon nanostructure, the GQD may be prepared as follows. In a first preparation method, an interlayer insertion material may be intercalated into graphite to prepare a graphite intercalation compound (GIC), and a GQD may be obtained therefrom.

The interlayer insertion material may be, for example, potassium sodium tartrate. When potassium sodium tartrate is used as the interlayer insertion material, the material may intercalate into graphite without an additional surfactant or a solvent during a solvo-thermal reaction to prepare a GIC, and then desired GQDs may be obtained by selecting particles according to the particle size of the resultant.

Potassium sodium tartrate may serve as an interlayer insertion material and as a solvent at the same time.

The solvo-thermal reaction may be performed in, for example, an autoclave. The solvo-thermal reaction may be performed at a temperature, for example, in a range of about 25° C. to about 400° C., or in some embodiments, at about, 250° C.

Examples of graphite as a starting material include natural graphite, kish graphite, synthetic graphite, expandable graphite or expanded graphite, or a mixture thereof.

Before performing the hydrothermal reaction, a nitration reaction may be performed on the polycyclic aromatic hydrocarbon. The nitration reaction may be performed using a hot nitrate (hot $HNO_3$).

During the hydrothermal reaction, an amine-based material, e.g., $NH_3$, $NH_2NH_2$, may be added. When such an amine-based material is added thereto, water-soluble $OH^-$ and an amine-functionalized GQD may be obtained.

According to a second preparation method, a GQD may be obtained by acid-treating graphite. For example, an acid and an oxidizing agent may be added to graphite, heated and allowed to react, and cooled to room temperature (25° C.) to obtain a mixture containing a GQD precursor. An oxidizing agent may be added to the mixture containing the precursor to undergo an oxidizing process, and the resultant may be worked up to prepare a desired GQD.

Examples of the acid include sulfuric acid, nitric acid, acetic acid, phosphoric acid, hydrofluoric acid, perchloric acid, trifluoroacetic acid, hydrochloric acid, m-chlorobenzoic acid, and a mixture thereof. Examples of the oxidizing agent include, potassium permanganate, potassium perchlorate, ammonium persulfate, and a mixture thereof. An amount of the oxidizing agent may be in a range of about 0.00001 parts to about 30 parts by weight based on 100 parts by weight of graphite.

Hereinafter, a GQD to which a functional group is attached may be prepared as follows. The functional group may be, for example, a hydroxyl group. A GQD to which a hydroxyl group is attached may be highly soluble in a solvent, and thus may be utilized in various applications.

A GQD to which a hydroxyl group according to one or more example embodiments may be prepared as follows.

A hydrothermal fusion reaction may be performed on a polycyclic aromatic hydrocarbon under an alkaline aqueous solution condition, which may result in a GQD having a single crystal. A hydrothermal reaction under the alkaline aqueous solution condition may be performed at a temperature in a range of about 90° C. to about 200° C. In the hydrothermal reaction, when alkaline species, e.g., $OH^-$, are present, hydrogen removal, condensation, or graphitization, and edge functionalization may occur. Examples of the polycyclic aromatic hydrocarbon may include a pyrene and a 1-nitropyrene.

During the hydrothermal reaction, an amine-based material, e.g., $NH_3$, $NH_2NH_2$, may be added. When such an amine-based material is added thereto, water-soluble $OH^-$ and an amine-functionalized GQD may be obtained.

Before performing the hydrothermal reaction, a nitration reaction may be performed on the polycyclic aromatic hydrocarbon. The nitration reaction may be performed using a hot nitrate salt or a hot nitric acid (e.g., hot $HNO_3$).

The reaction may proceed by adding the acid and the oxidizing agent to graphite and heating the resultant using, for example, microwave. The microwave may have an output in a range of about 50 Watts (W) to about 1,500 W and a frequency in a range of about 2.45 gigahertz (GHz) to about 60 GHz. Time for applying the microwave may vary depending on the frequency of the microwave, but the microwave may be applied for about 10 minutes to about 30 minutes.

The work-up process may include controlling the resultant having underwent the oxidizing process to room temperature, adding deionized water to dilute the resultant, and adding a base thereto to neutralize the resultant. The work-up process may also include a process of selecting particles from the resultant according to a particle size to obtain desired GQDs.

Hereinafter, a method of forming a pattern using a hardmask composition according to one or more embodiments will be described by referring to FIGS. 2A to 2E.

Figure 2A:
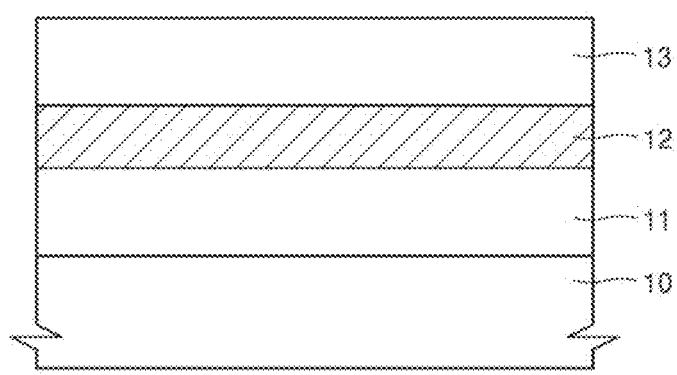
FIGS. 2A to 2E illustrate a method of forming a pattern using a hardmask composition according to one or more example embodiments.

Referring to FIG. 2A, a layer 11 may be formed on a substrate 10. A hardmask composition according to one or more embodiments may be provided on the layer 11 to form a hardmask 12.

A process of providing the hardmask composition may include one of spin coating, air spraying, electrospraying, dip coating, spray coating, doctor blade coating, or bar coating. When a hardmask is prepared by the foregoing methods, the preparation cost may be reduced, the preparation process may be simplified, and the preparation time may be shortened, as compared with a case in which a hardmask is prepared a chemical vapor deposition.

In some embodiments, the hardmask composition may be provided using a spin-on coating method. The hardmask composition may coat the substrate 10 at a thickness of, for example, in a range of about 10 nm to about 10,000 nm, and in some embodiments, about 10 nm to about 1,000 nm, but the thickness of the hard composition is not limited thereto.

The substrate 10 is not particularly limited. For example, the substrate 10 may include at least one of a Si substrate; a glass substrate; a GaN substrate; a silica substrate; a substrate including at least one selected from nickel (Ni), cobalt (Co), iron (Fe), platinum (Pt), palladium (Pd), gold (Au), aluminum (Al), chromium (Cr), copper (Cu), manganese (Mn), molybdenum (Mo), rhodium (Rh), iridium (Ir), tantalum (Ta), titanium (Ti), tungsten (W), uranium (U), vanadium (V), and zirconium (Zr); and a polymer substrate.

A photoresist layer 13 may be formed on the hardmask 12.

Figure 2B:
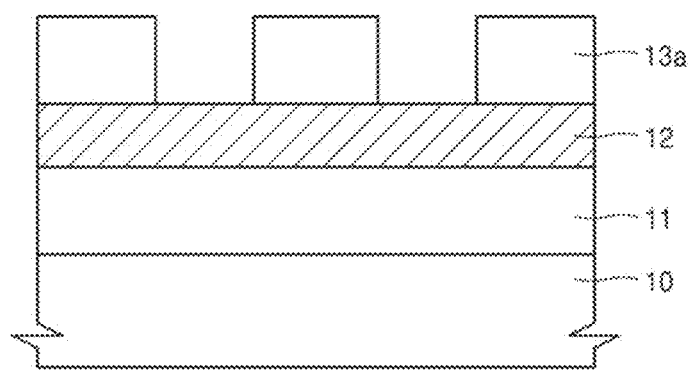

As shown in FIG. 2B, a photoresist pattern 13a may be formed by exposing and developing the photoresist layer 13 using a known method.

The process of exposing the photoresist layer 13 may be performed using, for example, ArF, KrF, or extreme ultra violet (EUV). After the exposing process, heat treatment may be performed on the exposed photoresist layer 13 at a temperature in a range of about 200° C. to about 500° C.

In the developing process, a developing solution, e.g., an aqueous solution of tetramethylammonium hydroxide (TMAH), may be used.

Figure 2C:
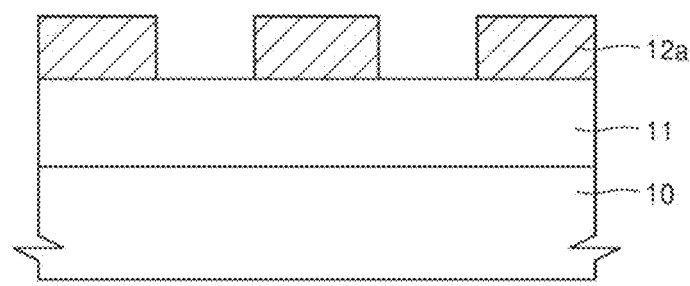

Subsequently, the hardmask 12 may be etched using the photoresist pattern 13a as an etching mask to form a hardmask pattern 12a on the layer 11 (FIG. 2C).

A thickness of the hardmask pattern 12a may be in a range of about 10 nm to about 10,000 nm. When the thickness of the hardmask pattern 12a is within this range, the layer may be in an accurate small pattern size and have desirable etching resistance as well as desirable homogeneousness.

For example, the etching process may be performed using a dry etching method using an etching gas. Examples of the etching gas include at least one of $CF_4$, $CHF_3$, $C_4F_8$, $Cl_2$, or $BCl_3$.

In some embodiments, when a mixture gas of $C_4F_8$ and $CHF_3$ is used as an etching gas, $C_4F_8$ may be mixed with $CHF_3$ at a volume ratio in a range of about 1:10 to about 10:1.

The layer 11 may be formed as a plurality of patterns. The plurality of patterns may vary, for example, may be a metal pattern, a semiconductor pattern, and an insulator pattern. For example, the plurality of patterns may be various patterns applied to a semiconductor integrated circuit device.

The layer 11 may contain a material that is to be finally patterned. The material of the layer 11 may be, for example, a metal (e.g., aluminum or copper), a semiconductor (e.g., silicon), or an insulator (e.g., silicon oxide or silicon nitride). The layer 11 may be formed using various methods (e.g., sputtering, electronic beam deposition, chemical vapor deposition, and physical vapor deposition). For example, the layer 11 may be formed using a chemical vapor deposition.

Figure 2D:
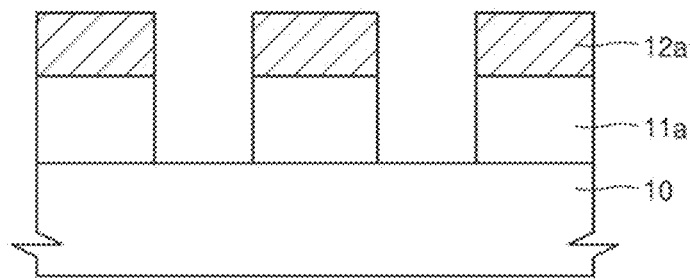
Figure 2E:
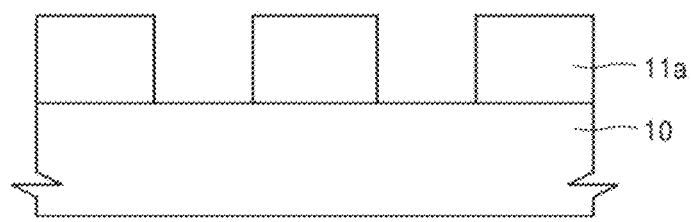

As shown in FIGS. 2D and 2E, the layer 11 may be etched using the hardmask pattern 12a as an etching mask to later form a layer pattern 11a having a desired fine pattern.

When the hardmask composition according to one or more example embodiments is used, a solution process may be available, coating equipment may not be necessary, ashing-off may be easily performed in an oxygen atmosphere, and mechanical properties may be excellent.

The hardmask according to one or more example embodiments may be inserted between other layers so as to use the hardmask as a stopper in the manufacture of a semiconductor device.

Hereinafter, a method of forming a pattern using a hardmask composition according to one or more embodiments will be described by referring to FIGS. 3A to 3D.

Figure 3A:
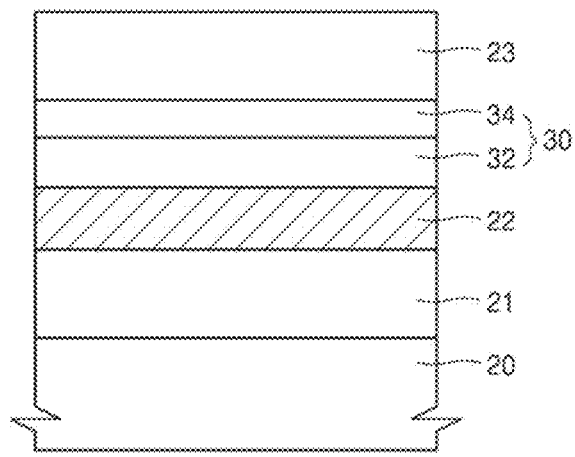
FIGS. 3A to 3D illustrate a method of forming a pattern using a hardmask composition according to one or more example embodiments.

Referring to FIG. 3A, a layer 21 may be formed on a substrate 20. The substrate 20 may be a silicon substrate, or any of the materials of the substrate 10 discussed in FIGS. 2A to 2E.

The layer 21 may be formed as, for example, a silicon oxide layer, a silicon nitride layer, a silicon nitroxide layer, a silicon carbide (SiC) layer, or a derivative layer thereof. Then, a hardmask composition according to one or more embodiments may be provided on the layer 21 to form a hardmask 22.

Figure 3B:
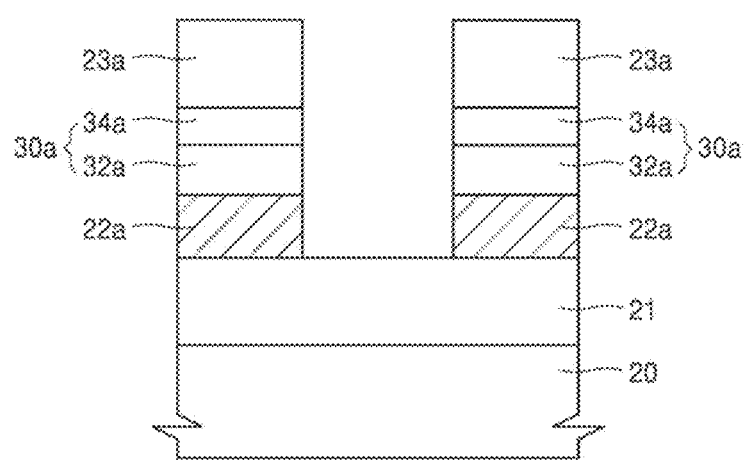
Figure 3C:
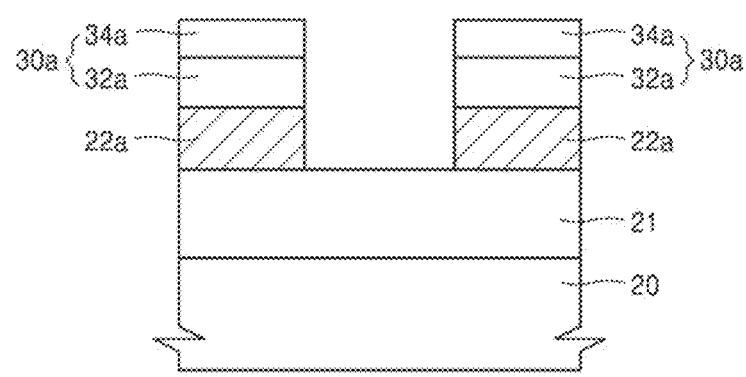

An anti-reflection layer 30 may be formed on the hardmask 22. The anti-reflection layer 30 may include an inorganic anti-reflection layer, an organic anti-reflection layer, or a combination thereof. FIGS. 3A to 3C illustrate embodiments in which the anti-reflection layer 30 includes an inorganic anti-reflection layer 32 and an organic anti-reflection layer 34.

The inorganic anti-reflection layer 32 may be, for example, a SiON layer, and the organic anti-reflection layer 34 may be a polymer layer commonly used in the art having an appropriate refraction index and a relatively high absorption coefficient with respect to a wavelength of light.

The thickness of the anti-reflection layer 30 may be, for example, in a range of about 100 nm to about 500 nm.

A photoresist layer 23 may be formed on the anti-reflection layer 30.

A photoresist pattern 23a may be formed by exposing and developing the photoresist layer 23 using a suitable method. Subsequently, the anti-reflection layer 30 and the hardmask 22 may be sequentially etched using the photoresist pattern 23a as an etching mask to form an anti-reflection pattern 30a and a hardmask pattern 22a on the layer 21. The anti-reflection pattern 30a may include an inorganic anti-reflection pattern 32a and an organic anti-reflection pattern 34a.

FIG. 3B illustrates that the photoresist pattern 23a and an anti-reflection pattern 30a remain after forming the hardmask pattern 22a. However, in some cases, part of or the whole of photoresist pattern 23a and the anti-reflection pattern 30a may be removed during an etching process for forming the hardmask pattern 22a.

In FIG. 3C, only the photoresist pattern 23a is removed.

Figure 3D:
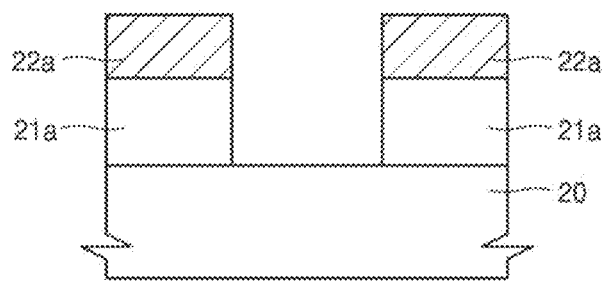

The layer 21 may be etched using the hardmask pattern 22a as an etching mask to form a desired layer pattern 21a (see FIG. 3D).

As described above, the hardmask pattern 22a is removed after forming the layer pattern 21a. In the preparation of the hardmask pattern 22a according to one or more example embodiments, the hardmask pattern 22a may be more easily removed using a suitable method, and little residue may remain after removing the hardmask pattern 22a.

The removing process of the hardmask pattern 22a may be performed by, but not limited to, $O_2$ ashing and wet stripping. For example, the wet stripping may be performed using alcohol, acetone, or a mixture of nitric acid and sulfuric acid.

A GQD in the hardmask prepared as above may have an amount of $sp^2$ carbon structures higher than the amount of $sp^3$ carbon structures. Thus, the hardmask may secure sufficient resistance to dry etching. In addition, such a hardmask may have desirable transparent properties, and thus an align mark for patterning may be more easily sensed.

According to one or more example embodiments, a pattern formed using a hardmask composition may be used in the manufacture and design of an integrated circuit device according to a preparation process of a semiconductor device. For example, the pattern may be used in the formation of a patterned material layer structure, e.g., metal wiring, holes for contact or bias, insulation sections (for example, a Damascene Trench (DT) or shallow trench isolation (STI), or a trench for a capacitor structure.

The term "alkyl", as used herein, in a chemical formula refers to a fully saturated branched or unbranched (or straight chain or linear) hydrocarbon group.

Examples of the "alkyl" include methyl, ethyl, n-propyl, isopropyl, n-butyl, isobutyl, sec-butyl, n-pentyl, isopentyl, neopentyl, n-hexyl, 3-methylhexyl, 2,2-dimethylpentyl, 2,3-dimethylpentyl, n-heptyl, and the like.

At least one hydrogen atom in the "alkyl" may be substituted with a halogen atom, a $C_1$-$C_{20}$ alkyl group (e.g., $CCF_3$, $CHCF_2$, $CH_2F$, or $CCl_3$) substituted with a halogen atom, a $C_1$-$C_{20}$ alkoxy group, a $C_2$-$C_{20}$ alkoxyalkyl group, a hydroxyl group, a nitro group, a cyano group, an amino group, a $C_1$-$C_{20}$ alkylamino group, an amidino group, a hydrazine group, a hydrazone group, a carboxyl group or a salt thereof, a sulfonyl group, a sulfamoyl group, a sulfonic acid group or a salt thereof, a phosphoric acid group or a salt thereof, a $C_1$-$C_{20}$ alkyl group, a $C_2$-$C_{20}$ alkenyl group, a $C_2$-$C_{20}$ alkynyl group, a $C_1$-$C_{20}$ heteroalkyl group, a $C_6$-$C_{20}$ aryl group, a $C_7$-$C_{20}$ arylalkyl group, a $C_2$-$C_{20}$ heteroaryl group, a $C_3$-$C_{20}$ heteroarylalkyl group, a $C_2$-$C_{20}$ heteroaryloxy group, or a $C_3$-$C_{20}$ heteroaryloxyalkyl group.

The term "halogen atom", as used herein, includes fluorine, bromine, chlorine, and iodine.

The term "heteroalkyl", as used herein, refers to an alkyl group including a heteroatom.

The term "alkenyl", as used herein, refers to a branched or non-branched hydrocarbon group having at least one carbon-carbon double bond. Examples of the alkenyl include vinyl, allyl, n-butenyl, isopropenyl, sec-butenyl, and isobutenyl. At least one hydrogen atom of the alkenyl group may be substituted with the same substituent groups as described above in connection with the alkyl group.

The term "alkynyl", as used herein, refers to a branched or non-branched hydrocarbon group having at least one carbon-carbon triple bond. Examples of the "alkynyl" include ethynyl, n-butynyl, sec-butynyl, isobutynyl, and propynyl.

The term "aryl" includes a group, wherein aromatic rings are fused to one or more carbocyclic rings. Examples of "aryl" include phenyl, naphthyl, tetrahydronaphthyl, and the like.

Also, at least one hydrogen atom of the "aryl" group may be substituted with the same substituents described above in connection with the alkyl group.

The term "heteroaryl", as used herein, refers to an aromatic group including at least one heteroatom selected from N, O, P, and S, wherein the rest of the cyclic atoms are all carbon atoms. The heteroaryl group may include, for example, one to five heteroatoms. In some embodiments, the heteroaryl group may include a five- to ten-membered ring. In a heteroaryl group, S or N may be present in various oxidized forms.

Examples of the heteroaryl include thienyl, furyl, pyrrolyl, imidazolyl, pyrazolyl, thiazolyl, isothiazolyl, 1,2,3-oxadiazolyl, 1,2,4-oxadiazolyl, 1,2,5-oxadiazolyl, 1,3,4-oxadiazolyl, 1,2,3-thiadiazolyl, 1,2,4-thiadiazolyl, 1,2,5-thiadiazolyl, 1,3,4-thiadiazolyl, isothiazol-3-yl, isothiazol-4-yl, isothiazol-5-yl, oxazol-2-yl, oxazol-4-yl, oxazol-5-yl, isoxazol-3-yl, isoxazol-4-yl, isoxazol-5-yl, 1,2,4-triazol-3-yl, 1,2,4-triazol-5-yl, 1,2,3-triazol-4-yl, 1,2,3-triazol-5-yl, tetrazolyl, pyridine-2-yl, pyridine-3-yl, pyrazine-2-yl, pyrazine-4-yl, pyrazine-5-yl, pyrimidine-2-yl, pyrimidine-4-yl, and pyrimidine-5-yl.

The term "heteroaryl" includes a group containing a heteroaromatic ring fused to at least one aryl, cycloaliphatic, or heterocyclic ring.

The term "carbon ring", as used herein, refers to a saturated or partially unsaturated non-aromatic monocyclic, bicyclic, or tricyclic hydrocarbon group.

Examples of the monocyclic hydrocarbon group include cyclopentyl, cyclopentenyl, cyclohexyl, and cyclohexenyl. Examples of the bicyclic hydrocarbon group include bornyl, decahydronaphthyl, bicyclo[2.1.1]hexyl, bicyclo[2.2.1]heptyl, bicyclo[2.2.1]heptenyl, and bicyclo[2.2.2]octyl. Examples of the tricyclic hydrocarbon group include adamantyl.

The term "heterocyclic" group, as used herein, refers to a ring containing at least one heteroatom, and including about 5 to about 20 carbon atoms, e.g., about 5 to about 10 carbon atoms. Here, the heteroatom is at least one selected from sulfur, nitrogen, oxygen, and phosphor.

The term "cyclicheteroalkylene group", as used herein, refers to a divalent cyclic hydrocarbon group containing at least one heteroatom.

The terms "alkoxy", "aryloxy", "heteroaryloxy" and "carbocyclic-oxy", as used herein, each refer to groups in which alkyl, aryl, heteroaryl and carbocyclic group are bound to an oxygen atom, respectively. The terms "alkylene", "alkenylene", "alkynylene", "arylene", and "heteroarylene", as used herein, are each substantially the same as "alkyl", "alkenyl", "alkynyl", "aryl", and "heteroaryl", respectively, except that they are divalent groups.

The term "substituted", as used herein, means that at least one hydrogen atom in a group or compound is substituted with a halogen atom, a $C_1$-$C_{20}$ alkyl group (e.g., $CCF_3$, $CHCF_2$, $CH_2F$, or $CCl_3$) substituted with a halogen atom, a $C_1$-$C_{20}$ alkoxy group, a $C_2$-$C_{20}$ alkoxyalkyl group, a hydroxyl group, a nitro group, a cyano group, an amino group, a $C_1$-$C_{20}$ alkylamino group, an amidino group, a hydrazine group, a hydrazone group, a carboxyl group or a salt thereof, a sulfonyl group, a sulfamoyl group, a sulfonic acid group or a salt thereof, a phosphoric acid group or a salt thereof, a $C_1$-$C_{20}$ alkyl group, a $C_2$-$C_{20}$ alkenyl group, a $C_2$-$C_{20}$ alkynyl group, a $C_1$-$C_{20}$ heteroalkyl group, a $C_6$-$C_{20}$ aryl group, a $C_7$-$C_{20}$ arylalkyl group, a $C_2$-$C_{20}$ heteroaryl group, a $C_3$-$C_{20}$ heteroarylalkyl group, a $C_2$-$C_{20}$ heteroaryloxy group, or a $C_3$-$C_{20}$ heteroaryloxyalkyl group.

Hereinafter, example embodiments will be described in detail with reference to the following examples. However, these examples are not intended to limit the scope of the example embodiments.

Preparation Example 1

2 grams (g) of citric acid (available from Aldrich Co., Ltd.) was dissolved in 300 milliliters (mL) of a 3 millimolar (mM) NaOH aqueous solution. Then, the resulting solution was reacted in an autoclave vessel at a temperature of 160° C. for 4 hours. The resultant was cooled to room temperature (25° C.). Ethanol was added to the mixture, which was then centrifuged to separate the product from unreacted reactant. The separated product was dissolved in 300 mL of deionized water, and filtered through a fine porous film having a pore diameter of 0.22 µm to remove an insoluble carbon product. Dialysis was performed on the filtrated resultant after the filtration for 2 days to obtain a GQD to which an OH group was bound. The major axis of the GQD to which an OH group was bound was about 5 nm, and the GQD was in a sheet form.

Preparation Example 2

20 mg of graphite (available from Alfa Aesar Co., Ltd.) was dissolved in 100 mL of concentrated sulfuric acid, and the mixture was sonicated for about 1 hour. 1 g of $KMnO_4$ was added thereto, and a temperature of the reaction mixture was adjusted to be about 25° C. or lower.

At atmospheric pressure, microwaves (power: about 600 W) were applied to the resultant while refluxing the resultant for 10 minutes. The reaction mixture was cooled so that a temperature of the reaction mixture was about 25° C., and then 700 mL of deionized water was added to the reaction mixture to dilute the reaction mixture. Next, sodium hydroxide was added to the reaction mixture in an ice bath so that a pH of the reaction mixture was adjusted to about 7.

The reaction mixture was filtered through a porous membrane having a pore diameter of about 200 nm to separate and remove graphene having a large size. Dialysis is performed on the obtained filtrate to remove residues, and graphene having a medium size were removed by using a centrifuge. The resultant was dried to obtain a GQD having a major axis of about 10 nm in a sheet form.

Preparation Example 3

160 mL of nitric acid was added to 2 g of pyrene, and the mixture was refluxed at a temperature of about 80° C. for about 12 hours to obtain a reaction mixture containing 1,3,6-trinitropyrene. The reaction mixture was cooled to room temperature, and 1 L of deionized water was added thereto to dilute the reaction mixture. Subsequently, this mixture was filtered through a fine porous film having a pore diameter of about 0.22 µm.

1.0 g of 1,3,6-trinitropyrene obtained after the filtration was dispersed in 0.6 L of a 0.2 molar (M) NaOH aqueous solution, and ultrasonic waves (500 W, 40 kHz) were then applied thereto for about 2 hours to obtain a suspension. The obtained suspension was placed in an autoclave vessel and was allowed to react at a temperature of about 200° C. for about 10 hours. The resultant was cooled to room temperature, and filtered through a fine porous film having a pore diameter of about 0.22 μm to remove an insoluble carbon product. 10 mL of hydrochloric acid and 1 L of deionized water were added to the solution that was filtered through the fine porous film, followed by stirring. The mixture was filtered through a fine porous film having a pore diameter of 0.22 μm to remove sodium ions and chloride ions. The slurry remaining on the fine porous film was dried to obtain a GQD to which an OH group was bound having a major axis of about 7 nm in a sheet form.

The GQD prepared in Preparation Examples 1 and 3 had a structure in which a functional group containing oxygen was positioned at an edge thereof. The GQD prepared in Preparation Example 2 had a structure in which a functional group containing oxygen was positioned at an edge and on a plane thereof by using microwaves during the preparation process.

Preparation Example 4

Chloroacetic acid was added to the GQD to which an OH group was bound prepared in Preparation Example 3, followed by heat treatment at a temperature of 80° C. for 60 minutes. After the heat treatment, a coupling reaction was performed to obtain a COOH-functionalized GQD. The major axis of the COOH-functionalized GQD was about 7 nm.

Example 1: Preparation of Hardmask Composition

The composite including a structure represented by Formula 6 (available from Aldrich Co., Ltd.) was mixed with the OH-functionalized GQD obtained in Preparation Example 3. The weight ratio of The composite and the OH-functionalized GQD is 1:4. N-methyl-2-pyrrolidone was added thereto to prepare a hardmask composition. In the hardmask composition, the amount of the composite including a structure represented by Formula 6 and the OH-functionalized GQD was about 10 wt %, based on the total weight of the hardmask composition.

Examples 2 and 3: Preparation of Hardmask Composition

Hardmask compositions were each prepared in substantially the same manner as in Example 1, except that the composite including a structure represented by Formula 6 was mixed with the OH-functionalized GQD obtained in Preparation Example 3 (having a size of about 7 nm) at a weight ratio of 1:3: and 1:5, respectively. In the Example 2, the weight ratio of The composite and the OH-functionalized GQD is 1:3. In the Example 3, the weight ratio of The composite and the OH-functionalized GQD is 1:5.

Examples 4 to 6: Preparation of Hardmask Composition

Hardmask compositions were each prepared in substantially the same manner as in Example 1, except that the composite including a structure represented by Formula 7, the composite including a structure represented by Formula 8, and the composite including a structure represented by Formula 9, were used instead of the composite including a structure represented by Formula 6, respectively.

Example 7: Preparation of Hardmask Composition

A Hardmask composition was prepared in substantially the same manner as in Example 1, except that the composite including a structure represented by Formula 10 was used instead of the composite including a structure represented by Formula 6.

Example 8: Preparation of Hardmask Composition

A composite represented by Formula 6 (available from Aldrich, Co., Ltd.), the OH-functionalized GQD obtained in Preparation Example 3, and fullerene represented by Formula 27 were mixed together at a weight ratio of 1:4:1. Subsequently, N-methyl-2-pyrrolidone was added thereto prepared a hardmask composition. The total content of the composite represented by Formula 6, the OH-functionalized GQD, and fullerene was 10 wt %, based on the total amount of the hardmask composition.

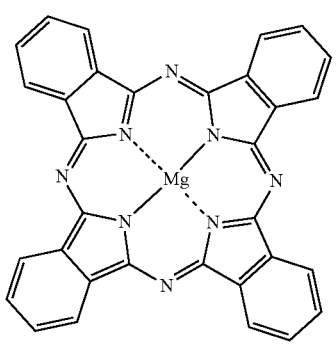

Formula 6

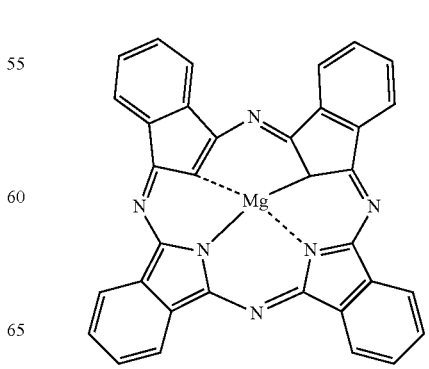

Formula 6

Formula 27

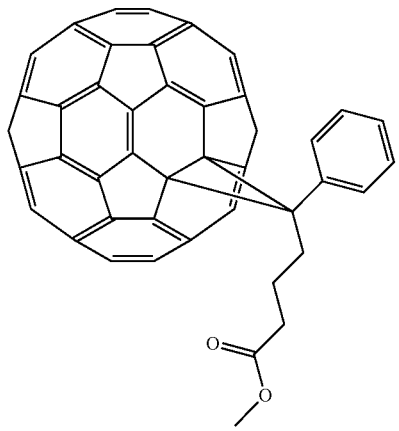

Example 9: Preparation of Hardmask Composition

A hardmask composition was prepared in substantially the same manner as in Example 1, except that a weight ratio of the composite represented by Formula 6 (available from Aldrich, Co., Ltd.) to the OH-functionalized GQD obtained in Preparation Example 3 to fullerene was changed to 1:4:2 in the preparation of the hardmask composition.

Manufacture Example 1: Manufacture of Silicon Substrate on which Silicon Oxide Pattern is Formed The hardmask composition prepared in Example 1 was spin-coated on a silicon substrate on which a silicon oxide layer had been formed. Subsequently, baking was performed thereon at a temperature of 400° C. for 2 minutes, to form a hardmask having a thickness of about 72 nm and including a product resulting from the treatment of the hardmask composition.

The hardmask was coated with an ArF photoresist at a thickness of about 1,700 Angstroms (Å) and then pre-baked at a temperature of about 110° C. for about 60 seconds. The resultant was then exposed to light using a light exposing instrument available from ASML (XT: 1400, NA 0.93) and post-baked at a temperature of about 110° C. for about 60 seconds. Next, the photoresist was developed using an aqueous solution of 2.38 wt % tetramethylammonium hydroxide (TMAH) to form a photoresist pattern.

Dry etching was performed using the photoresist pattern as a mask, and a $CF_4/CHF_3$ mixture gas. The etching conditions included 20 milliTorr (mT) of a chamber pressure, 1,800 W of a RT power, a 4/10 volume ratio of $CF_4/CHF_3$, and an etching time of about 120 seconds.

$O_2$ ashing and wet stripping were performed on a post hardmask and an organic material remaining after the dry etching to obtain a silicon substrate on which a desired silicon oxide pattern was formed as a final pattern.

Manufacture Examples 2 to 9: Manufacture of Silicon Substrate on which Silicon Oxide Pattern is Formed Silicon substrates on which silicon oxide pattern is formed were manufactured in substantially the same manner as in Manufacture Example 1, except that the hardmask compositions of Examples 2 to 9 were used instead of the hardmask composition of Example 1.

Comparative Example 1

A monomer represented by Formula 18 was dissolved in a mixed solvent of propylene glycol monomethyl ether acetate (PGMEA), methylpyrrolidone, and γ-butyrolactone (at a volume ratio of 40:20:40). The mixture was filtered to prepare a hardmask composition.

Formula 18

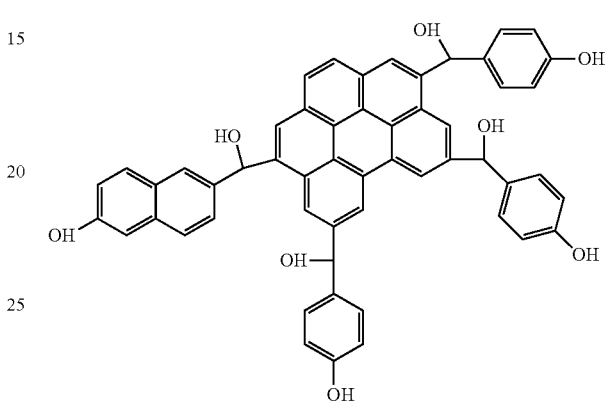

A hardmask composition was obtained as such. A silicon substrate, on which a silicon oxide layer had been formed, was coated with the hardmask composition using a spin-on coating method. The resultant was heat-treated at a temperature of 400° C. for 120 seconds to manufacture a hardmask including spin-on carbon (SOC).

The hardmask was coated with an ArF photoresist at a thickness of about 1,700 Å and then pre-baked at a temperature of about 110° C. for about 60 seconds. The resultant was then exposed to light using a light exposing instrument available from ASML (XT: 1400, NA 0.93) and post-baked at a temperature of about 110° C. for about 60 seconds. Next, the photoresist was developed using an aqueous solution of 2.38 wt % TMAH to form a photoresist pattern.

Dry etching was performed using the photoresist pattern as a mask, and a $CF_4/CHF_3$ mixture gas. The etching conditions included 20 mT of a chamber pressure, 1,800 W of a RT power, a 4/10 volume ratio of $CF_4/CHF_3$, and an etching time of about 120 seconds.

$O_2$ ashing and wet stripping were performed on a post hardmask and an organic material remaining after the dry etching to obtain a silicon substrate on which a desired silicon oxide pattern was formed as a final pattern.

Reference Example 1

An amount of 0.5 g of a OH-functionalized GQD obtained in Preparation Example 3 was dispersed in 1 L of water to prepare a hardmask composition. A silicon substrate, on which a silicon oxide layer had been formed, was coated with the hardmask composition using a spin-on coating method. The resultant was heat-treated at a temperature of 200° C. for 2 minutes. Subsequently, the resultant was baked at a temperature of 400° C. for 1 hour, and vacuum heat-treated at a temperature of 600° C. for 1 hour to prepare hardmask having a thickness of about 200 nm and containing a OH-functionalized GQD.

The hardmask was coated with an ArF photoresist at a thickness of about 1,700 Å and then pre-baked at a temperature of about 110° C. for about 60 seconds. The resultant was then exposed to light using a light exposing instrument available from ASML (XT: 1400, NA 0.93) and post-baked at a temperature of about 110° C. for about 60 seconds. Next, the photoresist was developed using an aqueous solution of 2.38 wt % TMAH to form a photoresist pattern.

Dry etching was performed using the photoresist pattern as a mask, and a $CF_4/CHF_3$ mixture gas. The etching conditions included 20 mT of a chamber pressure, 1,800 W of a RT power, a 4/10 volume ratio of $CF_4/CHF_3$, and an etching time of about 120 seconds.

$O_2$ ashing and wet stripping were performed on a post hardmask and an organic material remaining after the dry etching to obtain a silicon substrate on which a desired silicon oxide pattern was formed as a final pattern.

Evaluation Example 1: Solubility Test

The mixture of the composite including a structure represented by Formula 6 and the GQD of Preparation Example 3 at a weight ratio of 1:4, used in the preparation of the hardmask composition of Example 1, was tested its solubility with respect to NMP.

The solubility test results are shown in Table 1. For comparison of the solubility of the composite including a structure represented by Formula 6 with that of the mixture of the composite including a structure represented by Formula 6 and the GQD of Preparation Example 3, the solubility of the composite including a structure represented by Formula 6 is also shown in Table 1.

TABLE 1

| Material | Solubility (wt %) |
| --- | --- |
| The composite including a structure represented by Formula 6 | less than 2 wt % |
| The mixture of the composite including a structure represented by Formula 6 and the GQD of Preparation Example 3 at a weight | 10 wt % |

Referring to the results of Table 1, the mixture of the composite including a structure represented by Formula 6 and the GQD of Preparation Example 3 at a weight ratio of 1:4 was found to have significantly improved solubility with respect to NMP.

Evaluation Example 2: X-Ray Photoelectron Spectroscopy (XPS) Analysis

An XPS analysis was performed on the hardmask manufactured in Manufacture Example 1 and Reference Example 1. In the XPS analysis, Quantum 2000 (available from Physical Electronics. Inc., accelerating voltage in a range of 0.5 kilo electron volts (keV) to 15 keV, 300 Watts (W), energy resolution of about 1.0 electron volts (eV), minimum resolution area of 10 square micrometers, and a sputter rate of 0.1 nanometers per minute (nm/min)) was used.

The amount of each of carbon, nitrogen, oxygen and magnesium was analyzed by performing the XPS analysis. The results thereof are shown in Table 2.

TABLE 2

| | | Element | | | |
| --- | --- | --- | --- | --- | --- |
| | | C (atom %) | N (atom %) | O (atom %) | Mg (atom %) |
| Reference | GQD (in powder) | 81.19 | 1.91 | 16.90 | — |
| Manufacture Example 1 | Hardmask (MgPc:GQD at a weight ratio of 1:4) | 81.68 | 3.71 | 14.09 | 0.52 |

In Table 2, MgPc indicates the composite including a structure represented by Formula 6.

Referring to the results of Table 2, the hardmask of Manufacture Example 1 was found to have a reduced oxygen amount and an increased carbon amount, as compared with the hardmask of Reference Example 1. When a hardmask having such composition is used, as in Manufacture Example 1, a hardmask having improved stability and etching selectivity may be manufactured.

Evaluation Example 3: Etching Resistance

1) Manufacture Examples 1 to 9

Before and after performing dry etching upon the hardmasks manufactured in Manufacture Examples 1 to 9 and Reference Example 1, the thicknesses of the hardmask were measured. The etch rate thereof were calculated by Equation 1 to evaluate the etching resistance. The results of etching resistance evaluation are shown in Table 3.

Etch rate=(An initial thickness of the hardmask−a thickness of the hardmask after etching)/etching time (sec)     Equation 1

TABLE 3

| Hardmask | Etch rate (nm/sec) |
| --- | --- |
| Manufacture Example 1 | 0.74 |
| Manufacture Example 2 | 0.72 |
| Manufacture Example 3 | 0.78 |
| Manufacture Example 4 | 0.77 |
| Manufacture Example 5 | 0.72 |
| Manufacture Example 6 | 0.73 |
| Manufacture Example 7 | 0.73 |
| Manufacture Example 8 | 0.74 |
| Manufacture Example 9 | 0.75 |
| Reference Example 1 | 0.85 |

Referring to the results of Table 3, the etch rates of the hardmask of Manufacture Examples 1 to 9 were lower than that of the hardmask of Reference Example 1, and the etching selective rates of the hardmask of Manufacture Examples 1 to 9 were higher than that of the hardmask of Reference Example 1. Accordingly, it was found that the hardmask composition of Example 1 used in Manufacture Example 1 was found to have improved etching resistance, as compared with the hardmask of Reference Example 1.

Evaluation Example 4: Scanning Electron Microscope (SEM)

The substrate, on which the hardmask had been formed, manufactured in Manufacture Example 1 was analyzed by using a SEM. The results thereof are shown in FIG. 4.

Figure 4:
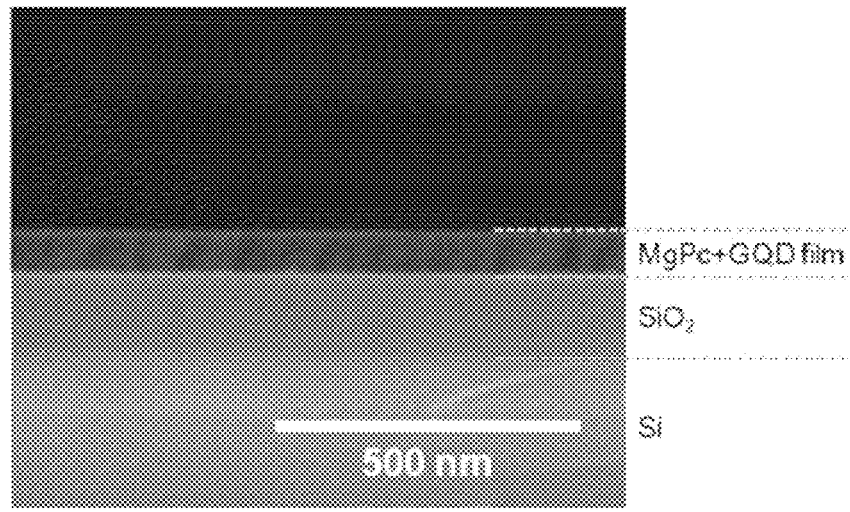
FIG. 4 is a scanning electron microscope (SEM) analysis result image of a silicon substrate on which a hardmask manufactured in Manufacture Example 1 is laminated.

Referring to FIG. 4, it can be seen that a hardmask containing the composite including a structure represented by Formula 6 (MgPc) and GQD was formed as a uniform thin film on the silicon oxide film of the silicon substrate.

FIGS. 5A to 5E are cross-sectional views for explaining a method of forming an electronic device using a hardmask composition according to some example embodiments.

Figure 5A:
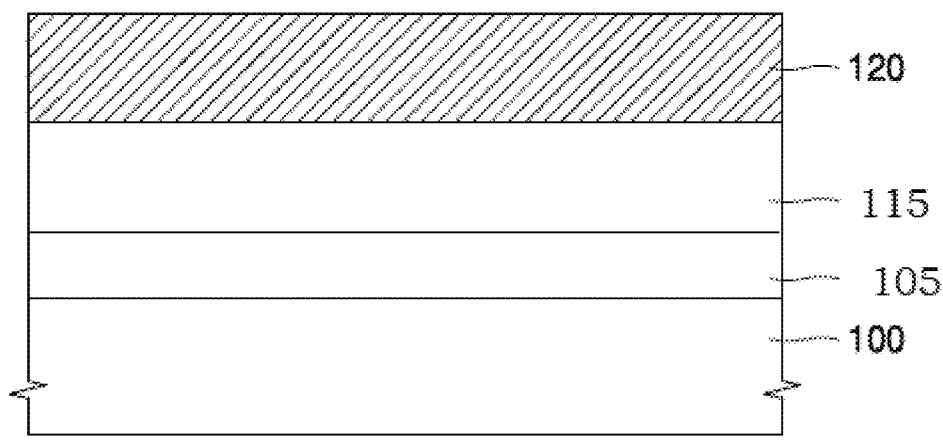
FIGS. 5A to 5E are cross-sectional views for explaining a method of forming an electronic device using a hardmask composition according to some example embodiments.

Referring to FIG. 5A, a gate dielectric 105 (e.g., silicon oxide) may be formed on a substrate 100. The substrate 100 may be formed of any one of the materials of the substrates 10 and 20 described above with reference to FIGS. 2A to 2E and 3A to 3D. A gate layer 115 (e.g., doped polysilicon) may be formed on the gate dielectric 105. A hardmask composition according to any of the above-described embodiments may be provided on a gate layer in order to form a hardmask layer 120.

Figure 5B:
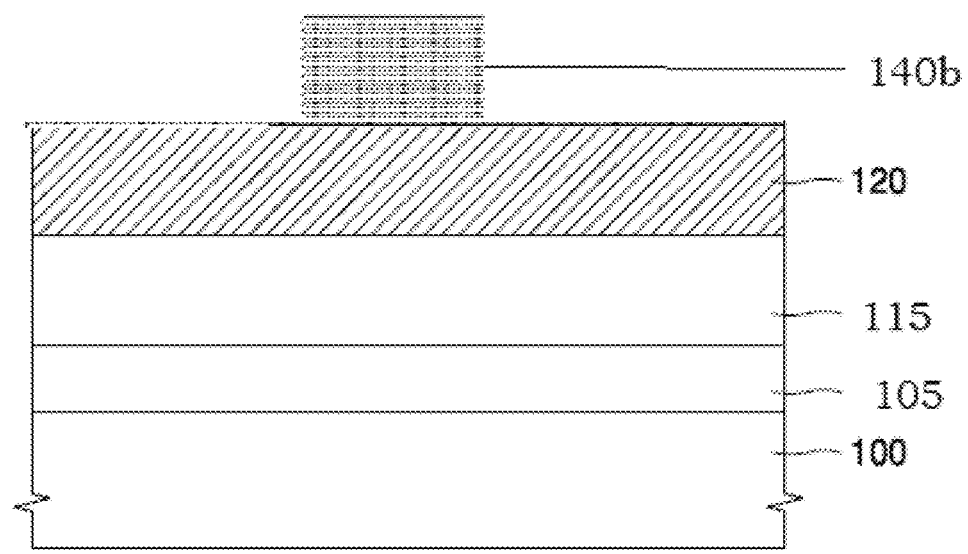

Referring to FIG. 5B, a photoresist pattern 140b may be formed on the hardmask layer 120.

Figure 5C:
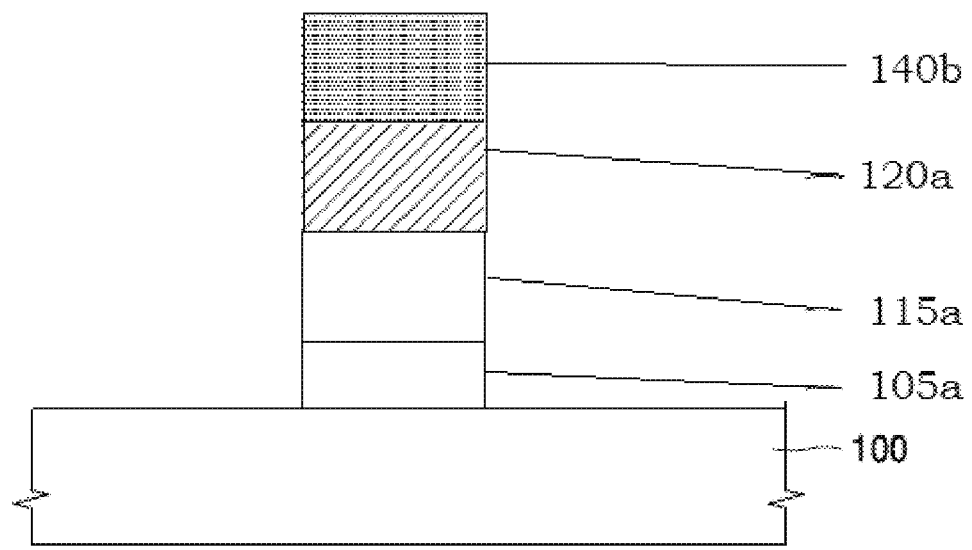

Referring to FIG. 5C, the gate layer 115 and the gate dielectric 105 may be etched to form a gate electrode pattern 115a and a gate dielectric pattern 105a. Although not illustrated in FIGS. 5B and 5C, in some embodiments, an anti-reflection layer like the anti-reflection layer 30 in FIG. 3A may be formed on the hardmask layer 120 before forming the photoresist pattern 140b on the hardmask layer 120 and the etching process described in FIG. 5C may form an anti-reflection pattern 30a on the gate electrode pattern 115a in some embodiments.

Figure 5D:
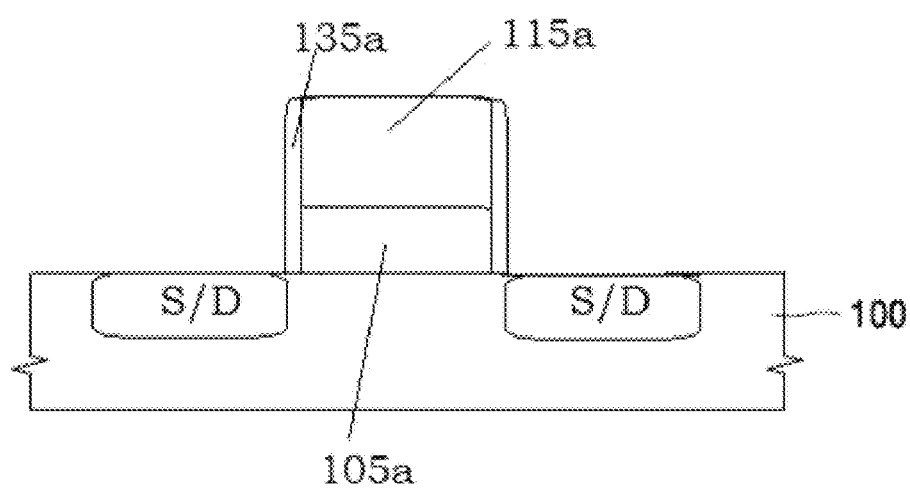

Referring to FIG. 5D, a spacer layer may be formed over the gate electrode pattern 115a and the gate dielectric pattern 105a. The spacer layer may be formed using a deposition process (e.g., CVD). The spacer layer may be etched to form spacers 135a (e.g., silicon nitride) on sidewalls of the gate electrode pattern 115a and the gate dielectric pattern 105a. After forming the spacers 135a, ions may be implanted into the substrate 100 to form source/drain impurity regions S/D.

Figure 5E:
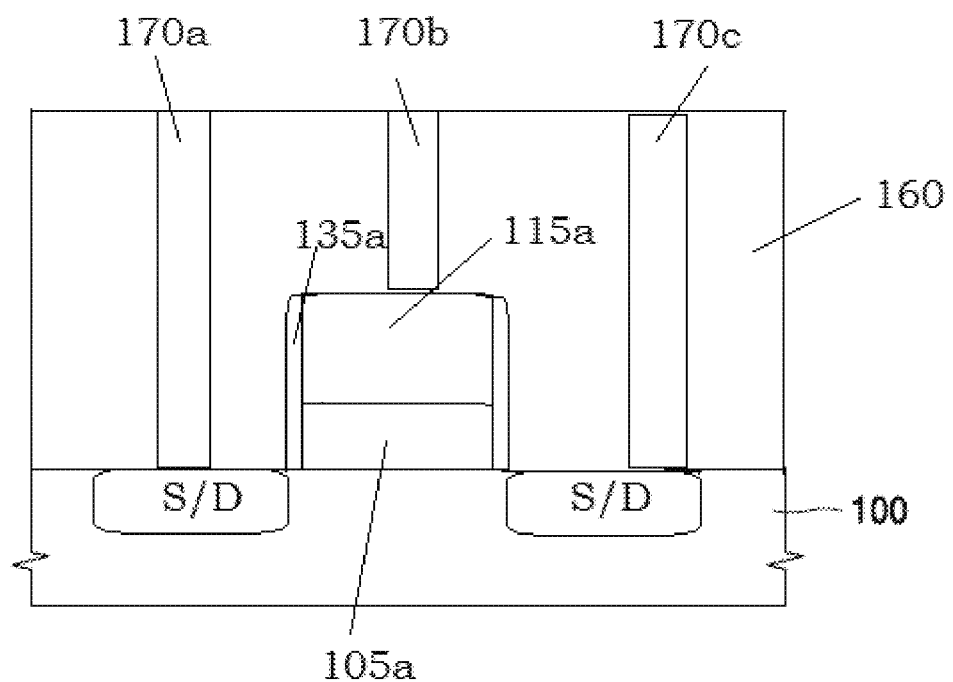

Referring to FIG. 5E, an interlayer insulating layer 160 (e.g., oxide) may be formed on the substrate 100 to cover the gate electrode pattern 115a, gate dielectric pattern 105a, and spacers 135a. Then, electrical contacts 170a, 170b, and 170c may be formed in the interlayer insulating layer 160 to connect to the gate electrode 115a and the S/D regions. The electrical contacts may be formed of a conductive material (e.g., metal). Although not illustrated, a barrier layer may be formed between sidewalls of the interlayer insulating layer 160 and the electrical contacts 170a, 170b, and 170c. While FIGS. 5A to 5E illustrate an example of forming a transistor, inventive concepts are not limited thereto. Hardmask compositions according one or more embodiments may be used in a patterning process to form other types of electronic devices.

As apparent from the foregoing description, a hardmask formed of a hardmask composition according to example embodiments may have desirable stability, and improved etching resistance and mechanical strength relative to those including a polymer that is generally used, and the hardmask may be more easily removed after an etching process. When such a hardmask is used, a pattern may be finely and evenly formed.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A hardmask composition comprising:
a solvent; and
a structure represented by Formula 1,

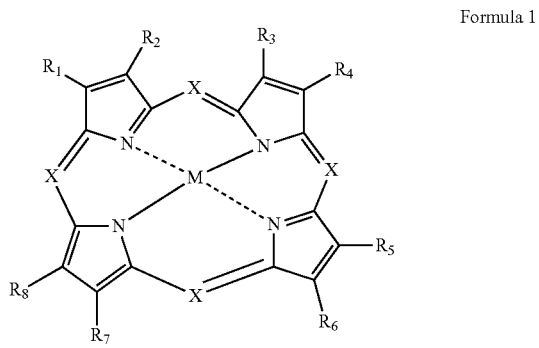

Formula 1 wherein, in Formula 1, X is $C(R_{11})$ or N,
$R_1$ to $R_8$ and $R_{11}$ each independently include one of hydrogen, a substituted or unsubstituted $C_1$-$C_{20}$ alkyl group, a substituted or unsubstituted $C_1$-$C_{20}$ alkoxy group, a substituted or unsubstituted $C_2$-$C_{20}$ alkenyl group, a substituted or unsubstituted $C_2$-$C_{20}$ alkynyl group, a substituted or unsubstituted $C_6$-$C_{20}$ aryl group, a substituted or unsubstituted $C_6$-$C_{20}$ aryloxy group, a substituted or unsubstituted $C_2$-$C_{20}$ heteroaryl group, a substituted or unsubstituted $C_2$-$C_{20}$ heteroaryloxy group, a substituted or unsubstituted $C_2$-$C_{20}$ carbocyclic group, a substituted or unsubstituted $C_2$-$C_{20}$ carbocyclic-oxy group, a substituted or unsubstituted $C_2$-$C_{20}$ heterocyclic group, a halogen atom, a cyano group, a hydroxyl group, an imide group, a carbonyl group, an epoxy group, a functional group including an epoxy group, —C(=O)R, —C(=O)NH$_2$, —C(=O)OR, —(CH$_2$)$_n$COOH where n is an integer from 1 to 10, or —N(R$_9$)(R$_{10}$), or
$R_1$ and $R_2$, $R_3$ and $R_4$, $R_5$ and $R_6$, and $R_7$ and $R_8$ are each independently bound to form a ring,
R includes one of hydrogen, a $C_1$-$C_{20}$ alkyl group, a $C_2$-$C_{20}$ alkenyl group, a $C_2$-$C_{20}$ alkynyl group, a $C_6$-$C_{20}$ aryl group, a $C_2$-$C_{20}$ heteroaryl group, or a $C_2$-$C_{20}$ heteroaryloxy group,
$R_9$ and $R_{10}$ each independently include one of hydrogen, a $C_1$-$C_{20}$ alkyl group, a $C_2$-$C_{20}$ alkenyl group, a $C_2$-$C_{20}$ alkynyl group, a $C_6$-$C_{20}$ aryl group, a $C_2$-$C_{20}$ heteroaryl group, or a $C_2$-$C_{20}$ heteroaryloxy group,
M includes an element from one of Groups 2 to 11 and 14, or an oxide thereof; and
at least one of a two-dimensional (2D) carbon nanostructure, a zero-dimensional (0D) carbon nanostructure, a precursor thereof, or a derivative thereof, wherein
the 2D carbon nanostructure includes at least one of graphene, a graphene quantum dot (GQD), reduced graphene oxide, a derivative thereof, or a heteroatom derivative thereof, and
the 0D carbon nanostructure includes at least one of flullerene, boron buckyball, carborane, or a derivative thereof.

2. The hardmask composition of claim 1, wherein in Formula 1, $R_1$ and $R_2$, $R_3$ and $R_4$, $R_5$ and $R_6$, and $R_7$ and $R_8$ are each independently bound to form a substituted or unsubstituted $C_6$ to $C_{20}$ aromatic ring.

3. The hardmask composition of claim 1, wherein the structure represented by Formula 1 is a structure represented by Formula 2 or 3:

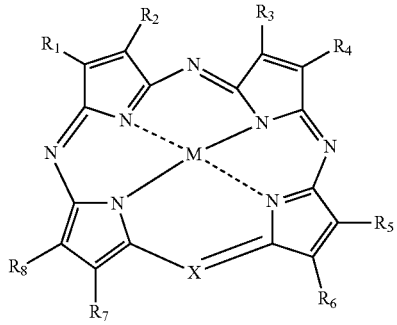

Formula 2

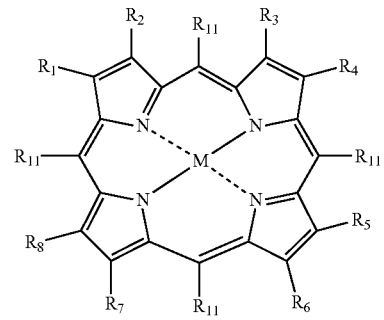

Formula 3 wherein, in Formula 2, M is at least one element of iron (Fe), nickel (Ni), cobalt (Co), manganese (Mn), magnesium (Mg), rhodium (Rh), osmium (Os), ruthenium (Ru), molybdenum (Mo), chromium (Cr), zinc (Zn), titanium (Ti), zirconium (Zr), silicon (Si), or copper (Cu), or an oxide thereof, $R_1$ to $R_8$ each independently includes one of hydrogen, a substituted or unsubstituted $C_1$-$C_{20}$ alkyl group, a substituted or unsubstituted $C_1$-$C_{20}$ alkoxy group, a substituted or unsubstituted $C_2$-$C_{20}$ alkenyl group, a substituted or unsubstituted $C_2$-$C_{20}$ alkynyl group, a substituted or unsubstituted $C_6$-$C_{20}$ aryl group, a substituted or unsubstituted $C_6$-$C_{20}$ aryloxy group, a substituted or unsubstituted $C_2$-$C_{20}$ heteroaryl group, a substituted or unsubstituted $C_2$-$C_{20}$ heteroaryloxy group, a substituted or unsubstituted $C_2$-$C_{20}$ carbocyclic group, a substituted or unsubstituted $C_2$-$C_{20}$ carbocyclic-oxy group, a substituted or unsubstituted $C_2$-$C_{20}$ heterocyclic group, a halogen atom, a cyano group, a hydroxyl group, an imide group, a carbonyl group, an epoxy group, a functional group comprising an epoxy group, —C(=O)R, —C(=O)NH$_2$, —C(=O)OR, —(CH$_2$)$_n$COOH where n is an integer from 1 to 10, or —N(R$_9$)(R$_{10}$), or $R_1$ and $R_2$, $R_3$ and $R_4$, $R_5$ and $R_6$, and $R_7$ and $R_8$ are each independently bound to form a $C_6$-$C_{20}$ aromatic ring, R includes one of hydrogen, a $C_1$-$C_{20}$ alkyl group, a $C_2$-$C_{20}$ alkenyl group, a $C_2$-$C_{20}$ alkynyl group, a $C_6$-$C_{20}$ aryl group, a $C_2$-$C_{20}$ heteroaryl group, and a $C_2$-$C_{20}$ heteroaryloxy group, and $R_9$ and $R_{10}$ each independently include one of hydrogen, a $C_1$-$C_{20}$ alkyl group, a $C_2$-$C_{20}$ alkenyl group, a $C_2$-$C_{20}$ alkynyl group, a $C_6$-$C_{20}$ aryl group, a $C_2$-$C_{20}$ heteroaryl group, or a $C_2$-$C_{20}$ heteroaryloxy group, and wherein, in Formula 3, M includes at least one of Fe, Ni, Co, Mn, Mg, Rh, Os, Ru, Mo, Cr, Zn, Ti(=O), Zr(=O), Si, or Cu, $R_1$ to $R_8$ each independently include one of hydrogen, a substituted or unsubstituted $C_1$-$C_{20}$ alkyl group, a substituted or unsubstituted $C_1$-$C_{20}$ alkoxy group, a substituted or unsubstituted $C_2$-$C_{20}$ alkenyl group, a substituted or unsubstituted $C_2$-$C_{20}$ alkynyl group, a substituted or unsubstituted $C_6$-$C_{20}$ aryl group, a substituted or unsubstituted $C_6$-$C_{20}$ aryloxy group, a substituted or unsubstituted $C_2$-$C_{20}$ heteroaryl group, a substituted or unsubstituted $C_2$-$C_{20}$ heteroaryloxy group, a substituted or unsubstituted $C_2$-$C_{20}$ carbocyclic group, a substituted or unsubstituted $C_2$-$C_{20}$ carbocyclic-oxy group, a substituted or unsubstituted $C_2$-$C_{20}$ heterocyclic group, a halogen atom, a cyano group, a hydroxyl group, an imide group, a carbonyl group, an epoxy group, a functional group comprising an epoxy group, —C(=O)R, —C(=O)NH$_2$, —C(=O)OR, —(CH$_2$)$_n$COOH where n is an integer from 1 to 10, or —N(R$_9$)(R$_{10}$), $R_{11}$ includes one of hydrogen, a substituted or unsubstituted $C_1$-$C_{20}$ alkyl group, a substituted or unsubstituted $C_6$-$C_{20}$ aryl group, a substituted or unsubstituted $C_6$-$C_{20}$ aryloxy group, a hydroxyl group, a carboxyl group, —C(=O)R, —C(=O)OR, or —N(R$_9$)(R$_{10}$), R includes one of hydrogen, a $C_1$-$C_{20}$ alkyl group, a $C_2$-$C_{20}$ alkenyl group, a $C_2$-$C_{20}$ alkynyl group, a $C_6$-$C_{20}$ aryl group, a $C_2$-$C_{20}$ heteroaryl group, or a $C_2$-$C_{20}$ heteroaryloxy group, and $R_9$ and $R_{10}$ each independently include one of hydrogen, a $C_1$-$C_{20}$ alkyl group, a $C_2$-$C_{20}$ alkenyl group, a $C_2$-$C_{20}$ alkynyl group, a $C_6$-$C_{20}$ aryl group, a $C_2$-$C_{20}$ heteroaryl group, or a $C_2$-$C_{20}$ heteroaryloxy group.

4. The hardmask composition of claim 1, wherein the structure represented by Formula 1 includes at least one of a structure represented by Formula 4, a structure represented by Formula 4a, a structure represented by Formula 5a, or a structure represented by Formula 5b:

Formula 4

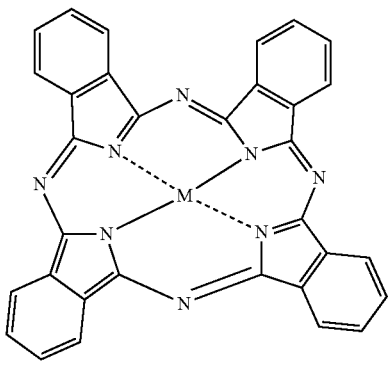

wherein, in Formula 4, M includes at least one of Fe, Ni, Co, Mn, Mg, Rh, Os, Ru, Mo, Cr, Zn, Ti(=O), Zr(=O), Si, or Cu, Formula 4a

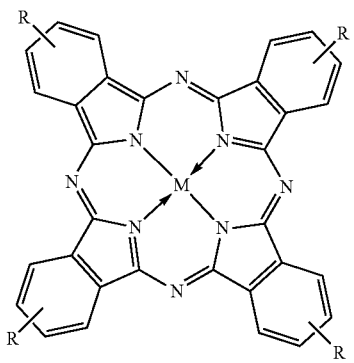

wherein, in Formula 4a, M includes at least one of Fe, Ni, Co, Mn, Mg, Rh, Os, Ru, Mo, Cr, Zn, Ti(=O), Zr(=O), Si, or Cu, and R is a mono-substituted or multi-substituted substituent that includes at least one of a $C_1$-$C_{20}$ alkyl group; a $C_1$-$C_{20}$ alkoxy group; a $C_6$-$C_{20}$ aryl group; a $C_6$-$C_{20}$ aryloxy group; a $C_2$-$C_{20}$ heteroaryl group; a $C_2$-$C_{20}$ heteroaryloxy group; a hydroxyl group; —C(=O)OH; —C(=O)O$R_1$, wherein $R_1$ is a $C_1$-$C_{10}$ alkyl group, a $C_2$-$C_{10}$ alkenyl group, or a $C_6$-$C_{20}$ aryl group; —NH$_2$; —N($R_2$)($R_3$), wherein $R_2$ and $R_3$ are each independently a $C_1$-$C_{10}$ alkyl group or a $C_6$-$C_{20}$ aryl group; —(CH$_2$)$_n$COOH where n is an integer from 1 to 10; —CONH$_2$; a cyano group; or a functional group comprising an epoxy group, Formula 5a

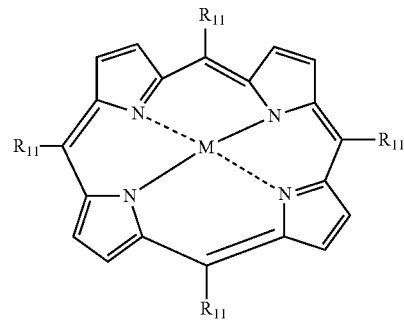

wherein, in Formula 5a, M includes at least one of Fe, Ni, Co, Mn, Mg, Rh, Os, Ru, Mo, Cr, Zn, Ti(=O), Zr(=O), Si, or Cu, and $R_{11}$ includes a substituted $C_6$-$C_{20}$ aryl group, and Formula 5b

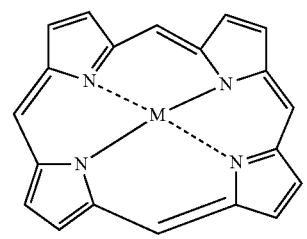

wherein, in Formula 5b, M includes at least one of Fe, Ni, Co, Mn, Mg, Rh, Os, Ru, Mo, Cr, Zn, Ti(=O), Zr(=O), Si, or Cu.

5. The hardmask composition of claim 1, wherein the structure represented by Formula 1 include a structure represented by at least one of Formulae 6a, 7a, or 8a:

Formula 6a

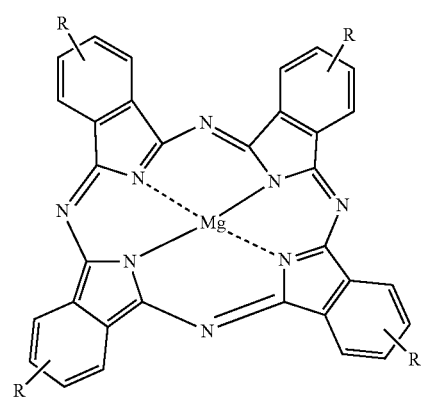

Formula 7a

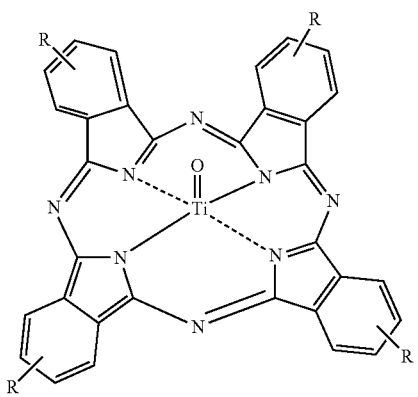

Formula 8a

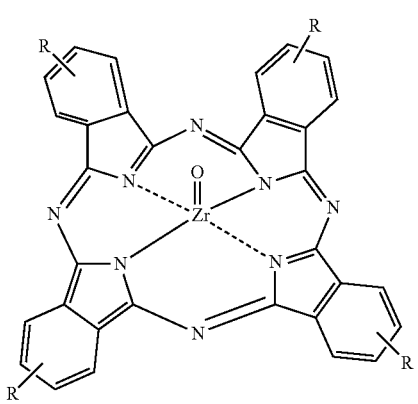

wherein, in Formulae 6a, 7a, and 8a, R is a mono-substituted or multi-substituted substituent that includes at least one of a $C_1$-$C_{20}$ alkyl group; a $C_1$-$C_{20}$ alkoxy group; a $C_6$-$C_{20}$ aryl group; a $C_6$-$C_{20}$ aryloxy group; a $C_2$-$C_{20}$ heteroaryl group; a $C_2$-$C_{20}$ heteroaryloxy group; a hydroxyl group; —C(=O)OH; —C(=O)O$R_1$, wherein $R_1$ is a $C_1$-$C_{10}$ alkyl group, a $C_2$-$C_{10}$ alkenyl group, or a $C_6$-$C_{20}$ aryl group; —NH$_2$; —N($R_2$)($R_3$), wherein $R_2$ and $R_3$ are each independently a $C_1$-$C_{10}$ alkyl group or a $C_6$-$C_{20}$ aryl group; —(CH$_2$)$_n$COOH where n is an integer from 1 to 10; —CONH$_2$; a cyano group; or a functional group comprising an epoxy group.

6. The hardmask composition of claim 1, wherein the structure represented by Formula 1 includes a structure represented by at least one of Formulae 6 to 12:

Formula 6

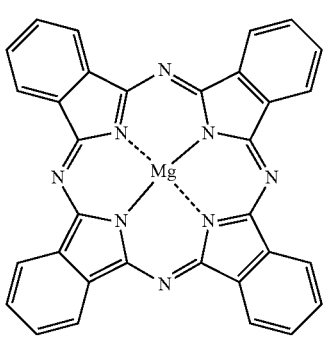

Formula 7

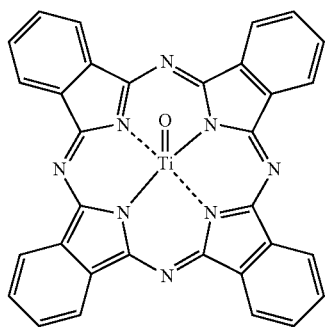

Formula 8

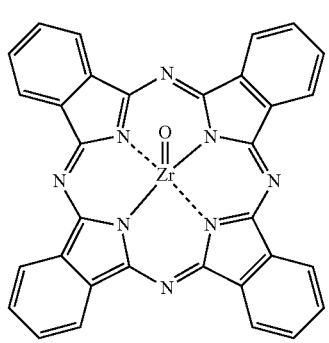

Formula 9

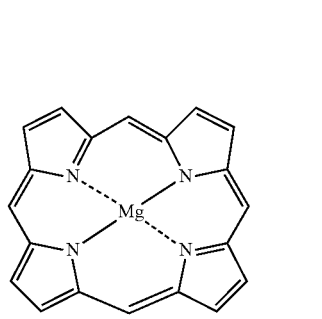

Formula 10

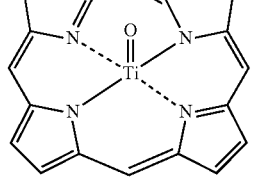

Formula 11

Formula 12

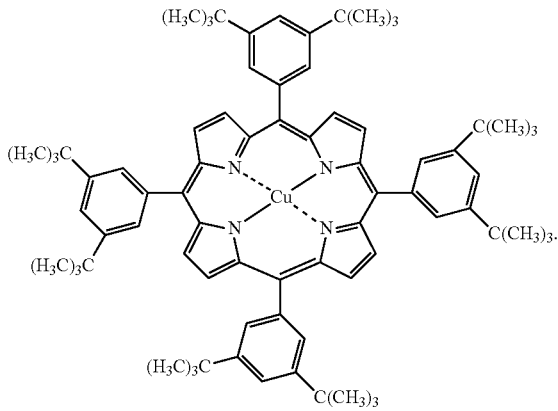

7. The hardmask composition of claim 1, wherein an amount of the structure represented by Formula 1 is in a range of about 5 parts to about 50 parts by weight, based on 100 parts by weight of the hardmask composition.

8. The hardmask composition of claim 1, wherein
the 2D carbon nanostructure has a size in a range of about 1 nanometer (nm) to about 50 nm, and
a number of layers in the 2D carbon nanostructure is greater than 0 and less than or equal to about 300.

9. The hardmask composition of claim 8, wherein
the hardmask composition includes the structure represented by Formula 1 mixed with at least one of the 2D carbon nanostructure or the 0D carbon nanostructure, at a weight ratio of about 1:99 to about 99:1.

10. The hardmask composition of claim 1, wherein
the 2D carbon nanostructure is a graphene quantum dot (GQD) having a size in a range of about 1 nm to about 10 nm, and
the GQD includes at least one of a hydroxyl group, a carbonyl group, a carboxyl group, an epoxy group, an amine group, or an imide group bound at a terminal (edge) of the GQD.

11. The hardmask composition of claim 1, wherein
the 2D carbon nanostructure is an OH-functionalized graphene quantum dot (GQD) or a COOH-functionalized GQD.

12. The hardmask composition of claim 1, wherein the solvent includes at least one of water, methanol, isopropanol, ethanol, N,N-dimethylformamide, N-methyl-2-pyrrolidone, dichloroethane, dichlorobenzene, dimethylsulfoxide, aniline, propylene glycol, propylene glycol diacetate, methoxypropanediol, diethylene glycol, acetyl acetone, cyclohexanone, γ-butyrolactone, nitromethane, tetrahydrofuran, nitrobenzene, butyl nitrite, methyl cellosolve, ethyl cellosolve, diethyl ether, diethylene glycol methyl ether, diethylene glycol ethyl ether, dipropylene glycol methyl ether, toluene, xylene, hexane, methylethylketone, methyl isobutyl ketone, hydroxymethylcellulose, propylene glycol monomethyl ether acetate (PGMEA), propylene glycol monomethyl ether (PGME), cyclohexanone, ethyl lactate, or heptane.

13. A hardmask composition comprising:
a solvent;
a first material, a second material, or a mixture of the first material and the second material; and
a structure represented by Formula 1, Formula 1

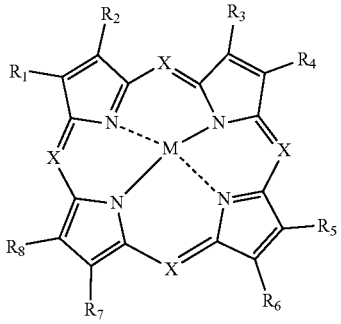

wherein, in Formula 1, X is C(Rn) or N, $R_1$ to $R_8$ and $R_{11}$ each independently include one of hydrogen, a substituted or unsubstituted $C_1$-$C_{20}$ alkyl group, a substituted or unsubstituted $C_1$-$C_{20}$ alkoxy group, a substituted or unsubstituted $C_2$-$C_{20}$ alkenyl group, a substituted or unsubstituted $C_2$-$C_{20}$ alkynyl group, a substituted or unsubstituted $C_6$-$C_{20}$ aryl group, a substituted or unsubstituted $C_6$-$C_{20}$ aryloxy group, a substituted or unsubstituted $C_1$-$C_{20}$ heteroaryl group, a substituted or unsubstituted $C_2$-$C_{20}$ heteroaryloxy group, a substituted or unsubstituted $C_2$-$C_{20}$ carbocyclic group, a substituted or unsubstituted $C_2$-$C_{20}$ carbocyclic-oxy group, a substituted or unsubstituted $C_2$-$C_{20}$ heterocyclic group, a halogen atom, a cyano group, a hydroxyl group, an imide group, a carbonyl group, an epoxy group, a functional group including an epoxy group, —C(=O)R, —C(=O)NH$_2$, —C(=O)OR, —(CH$_2$)$_n$COOH where n is an integer from 1 to 10, or —N(R$_9$)(R$_{10}$), or $R_1$ and $R_2$, $R_3$ and $R_4$, $R_5$ and $R_6$, and $R_7$, and $R_8$ are each independently bound to form a ring, R includes one of hydrogen, a $C_1$-$C_{20}$ alkyl group, a $C_2$-$C_{20}$ alkenyl group, a $C_2$-$C_{20}$ alkynyl group, a $C_6$-$C_{20}$ aryl group, a $C_2$-$C_{20}$ heteroaryl group, or a $C_2$-$C_{20}$ heteroaryloxy group, $R_9$ and $R_{10}$ each independently include one of hydrogen, a $C_1$-$C_{20}$ alkyl group, a $C_2$-$C_{20}$ alkenyl group, a $C_2$-$C_{20}$ alkynyl group, a $C_6$-$C_{20}$ aryl group, a $C_2$-$C_{20}$ heteroaryl group, or a $C_2$-$C_{20}$ heteroaryloxy group, and M includes an element from one of Groups 2 to 11 and 14, or an oxide thereof, and wherein the first material includes one of a monomer including an aromatic ring or a polymer that includes a repeating unit of the monomer, and the second material includes one of a hexagonal boron nitride, a chalcogenide-based material, or a precursor thereof.

14. The hardmask composition of claim 13, wherein
the monomer and the polymer of the first material include at least one structure represented by Formulae 13 or 14:

Formula 13

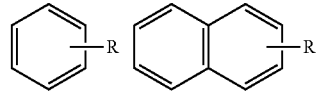

-continued

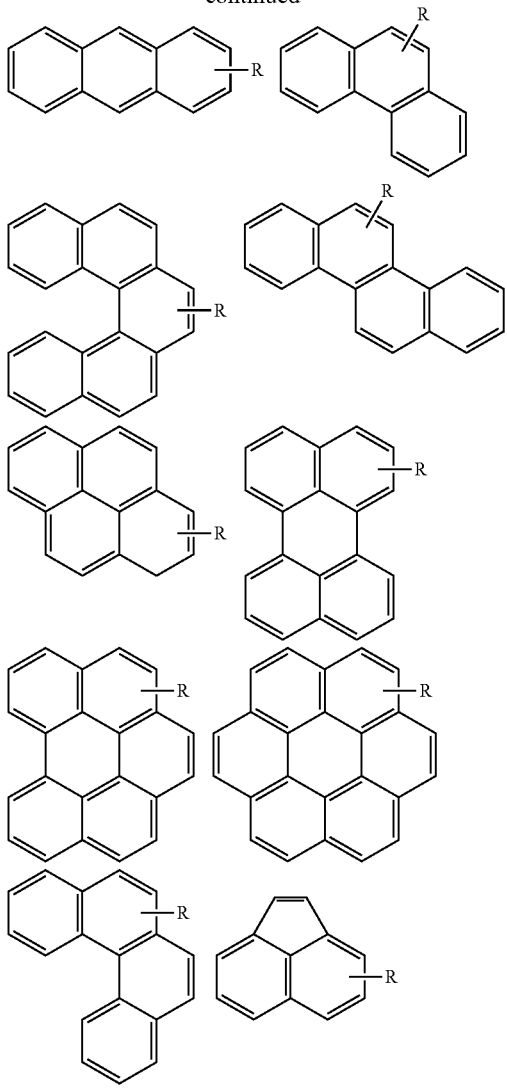

wherein, in Formula 13, R includes hydrogen or a mono-substituted or a multi-substituted substituent that includes at least one of a halogen atom, a hydroxyl group, an isocyanate group, a glycidyloxy group, a carboxyl group, an aldehyde group, an amino group, a siloxane group, an epoxy group, an imino group, a urethane group, an ester group, an amide group, an imide group, an acryl group, a methacryl group, a substituted or unsubstituted $C_1$-$C_{30}$ saturated organic group, or a substituted or unsubstituted $C_1$-$C_{30}$ unsaturated organic group, and A-L-A'  Formula 14 wherein, in Formula 14, A and A' are identical to or different from each other and are each a monovalent organic group derived from one of the structures represented by Formula 13; and L is a linker which represents a single bond or includes at least one of a substituted or unsubstituted $C_1$-$C_{30}$ alkylene group, a substituted or unsubstituted $C_2$-$C_{30}$ alkenylene group, a substituted or unsubstituted $C_2$-$C_{30}$ alkynylene group, a substituted or unsubstituted $C_7$-$C_{30}$ arylene-alkylene group, a substituted or unsubstituted $C_6$-$C_{30}$ arylene group, a substituted or unsubstituted $C_2$-$C_{30}$ heteroarylene group, a substituted or unsubstituted $C_3$-$C_{30}$ heteroarylene-alkylene group, a substituted or unsubstituted $C_1$-$C_{30}$ alkylene-oxy group, a substituted or unsubstituted $C_7$-$C_{30}$ arylenealkyleneoxy group, a substituted or unsubstituted $C_6$-$C_{30}$ aryleneoxy group, a substituted or unsubstituted $C_2$-$C_{30}$ heteroaryleneoxy group, a substituted or unsubstituted $C_3$-$C_{30}$ heteroarylene-alkylene-oxy group, —C(=O)—, or —SO$_2$—, and in L, the substituted $C_1$-$C_{30}$ alkylene group, the substituted $C_2$-$C_{30}$ alkenylene group, the substituted $C_2$-$C_{30}$ alkynylene group, the substituted $C_7$-$C_{30}$ arylene-alkylene group, the substituted $C_6$-$C_{30}$ arylene group, the substituted $C_2$-$C_{30}$ heteroarylene group, the substituted $C_3$-$C_{30}$ heteroarylene-alkylene group, the substituted $C_1$-$C_{30}$ alkylene-oxy group, the substituted $C_7$-$C_{30}$ arylenealkyleneoxy group, the substituted $C_6$-$C_{30}$ aryleneoxy group, the substituted $C_2$-$C_{30}$ heteroaryleneoxy group, and the substituted $C_3$-$C_{30}$ heteroarylene-alkylene-oxy group are each optionally substituted with at least one substituent that includes a halogen atom, a hydroxyl group, an isocyanate group, a glycidyloxy group, a carboxyl group, an aldehyde group, an amino group, a siloxane group, an epoxy group, an imino group, a urethane group, an ester group, an amide group, an imide group, an acryl group, or a methacryl group.

15. The hardmask composition of claim 13, wherein the monomer includes a structure represented by at least one of Formulae 17a to 17c:

Formula 17a

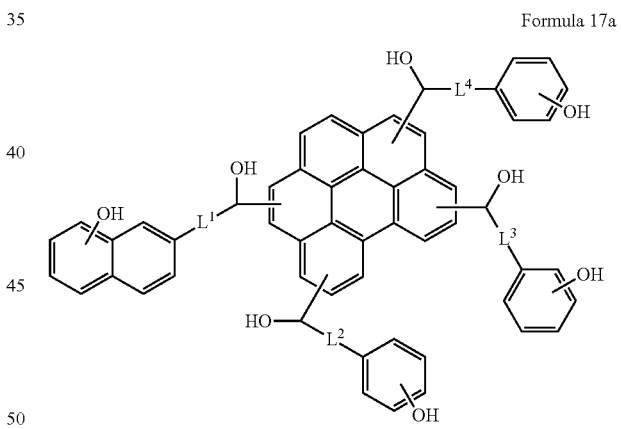

Formula 17b

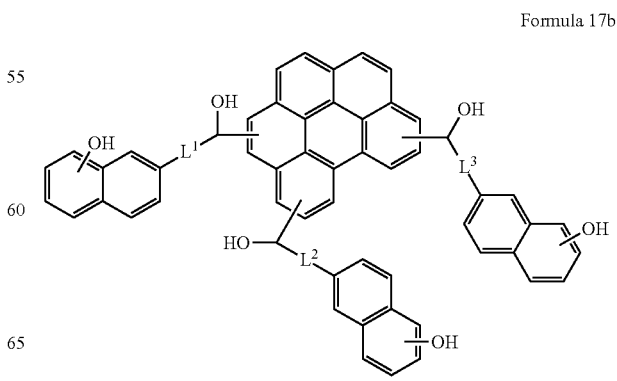

-continued

Formula 17c

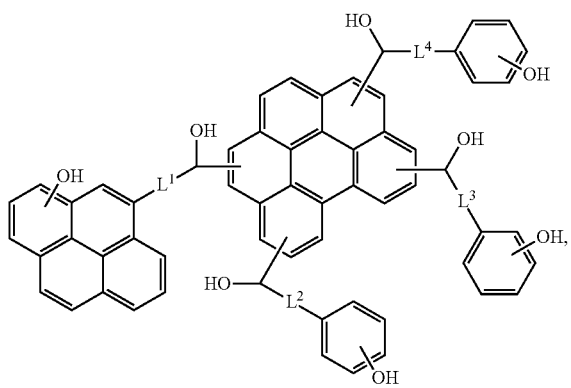

wherein, in Formulae 17a, 17b, and 17c, $L^1$ to $L^4$ are each independently a single bond or a substituted or unsubstituted $C_1$-$C_6$ alkylene group.

16. The hardmask composition of claim 13, wherein the monomer includes a structure represented by at least one of Formulae 17d to 17f:

Formula 17d

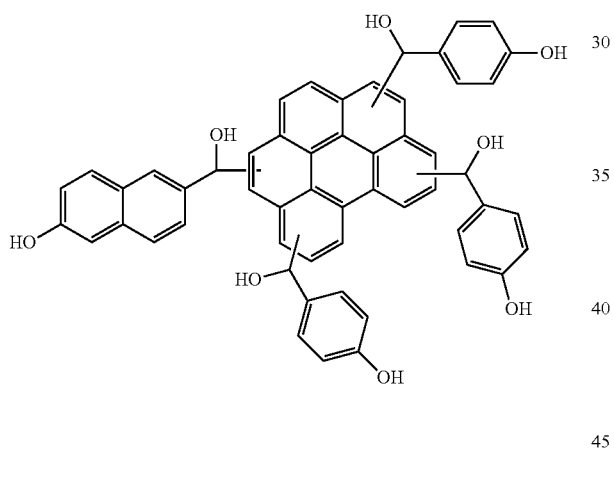

Formula 17e

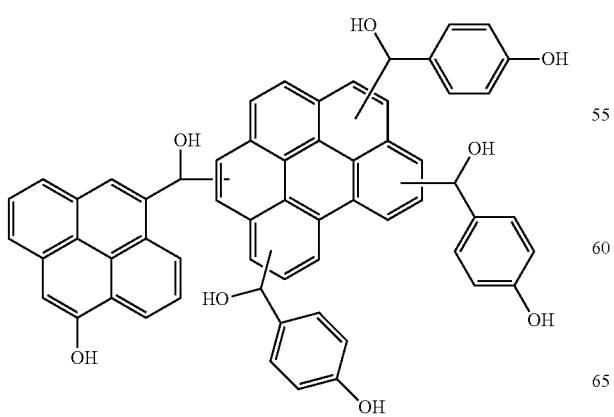

-continued

Formula 17f

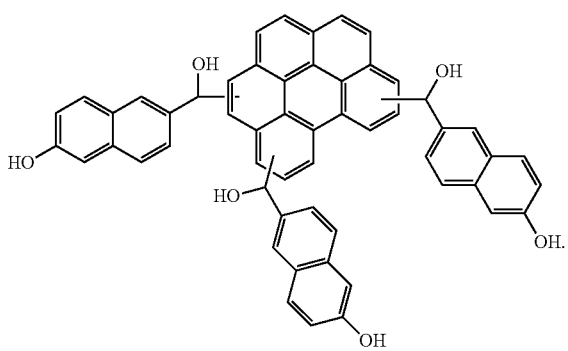

17. A hardmask comprising:
a product obtained by coating and heat-treating the hardmask composition of claim 1.

18. The hardmask of claim 17, wherein
the hardmask includes the structure represented by Formula 1, or
the hardmask includes the structure represented by Formula 1 and at least one of a 2D carbon nanostructure, a 0D carbon nanostructure, or a derivative thereof.

19. A hardmask composition comprising:
at least one of a two-dimensional (2D) carbon nanostructure, a zero-dimensional (0D) carbon nanostructure, or a derivative thereof; and
a structure represented by Formula 1, Formula 1

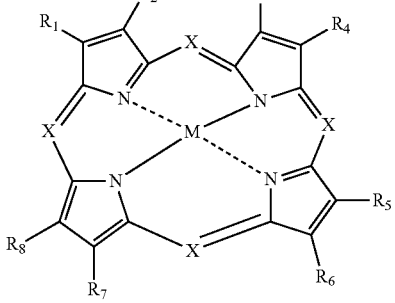

wherein, in Formula 1, X is $C(R_{11})$ or N,
$R_1$ to $R_8$ and $R_{11}$ each independently include one of hydrogen, a substituted or unsubstituted $C_1$-$C_{20}$ alkyl group, a substituted or unsubstituted $C_1$-$C_{20}$ alkoxy group, a substituted or unsubstituted $C_2$-$C_{20}$ alkenyl group, a substituted or unsubstituted $C_2$-$C_{20}$ alkynyl group, a substituted or unsubstituted $C_6$-$C_{20}$ aryl group, a substituted or unsubstituted $C_6$-$C_{20}$ aryloxy group, a substituted or unsubstituted $C_2$-$C_{20}$ heteroaryl group, a substituted or unsubstituted $C_2$-$C_{20}$ heteroaryloxy group, a substituted or unsubstituted $C_2$-$C_{20}$ carbocyclic group, a substituted or unsubstituted $C_2$-$C_{20}$ carbocyclic-oxy group, a substituted or unsubstituted $C_2$-$C_{20}$ heterocyclic group, a halogen atom, a cyano group, a hydroxyl group, an imide group, a carbonyl group, an epoxy group, a functional group including an epoxy group, —C(=O)R, —C(=O)NH$_2$, —C(=O)OR, —(CH$_2$)$_n$COOH where n is an integer from 1 to 10, or —N(R$_9$)(R$_{10}$), or $R_1$ and $R_2$, $R_3$ and $R_4$, $R_5$ and $R_6$, and $R_7$ and $R_8$ are each independently bound to form a ring, R includes one of hydrogen, a $C_1$-$C_{20}$ alkyl group, a $C_2$-$C_{20}$ alkenyl group, a $C_2$-$C_{20}$ alkynyl group, a $C_6$-$C_{20}$ aryl group, a $C_2$-$C_{20}$ heteroaryl group, or a $C_2$-$C_{20}$ heteroaryloxy group, $R_9$ and $R_{10}$ each independently include one of hydrogen, a $C_1$-$C_{20}$ alkyl group, a $C_2$-$C_{20}$ alkenyl group, a $C_2$-$C_{20}$ alkynyl group, a $C_6$-$C_{20}$ aryl group, a $C_2$-$C_{20}$ heteroaryl group, or a $C_2$-$C_{20}$ heteroaryloxy group, and M includes an element from one of Groups 2 to 11 and 14, or an oxide thereof, wherein the 0D carbon nanostructure includes at least one of fullerene, boron buckyball, carborane, or a derivative thereof, the 2D carbon nanostructure includes at least one of graphene, a graphene quantum dot (GQD), reduced graphene oxide, a derivative thereof, or a heteroatom derivative thereof.

20. The hardmask composition of claim 19, wherein the at least one of the 2D carbon nanostructure, the 0D carbon nanostructure, or the derivative thereof is the 2D carbon nanostructure.

21. The hardmask composition of claim 19, wherein the at least one of the 2D carbon nanostructure, the 0D carbon nanostructure, the precursor thereof, or the derivative thereof is the 0D carbon nanostructure.

22. The hardmask composition of claim 19, further comprising:

a solvent, wherein the solvent includes at least one of water, methanol, isopropanol, ethanol, N,N-dimethylformamide, N-methyl-2-pyrrolidone, dichloroethane, dichlorobenzene, dimethylsulfoxide, aniline, propylene glycol, propylene glycol diacetate, methoxypropanediol, diethylene glycol, acetyl acetone, cyclohexanone, γ-butyrolactone, nitromethane, tetrahydrofuran, nitrobenzene, butyl nitrite, methyl cellosolve, ethyl cellosolve, diethyl ether, diethylene glycol methyl ether, diethylene glycol ethyl ether, dipropylene glycol methyl ether, toluene, xylene, hexane, methylethylketone, methyl isoketone, hydroxymethylcellulose, propylene glycol monomethyl ether acetate (PGMEA), propylene glycol monomethyl ether (PGME), cyclohexanone, ethyl lactate, or heptane.

23. The hardmask composition of claim 19, further comprising:

a first material, a second material, or a mixture of the first material and the second material, wherein the first material includes one of a monomer including an aromatic ring or a polymer that includes a repeating unit of the monomer, and the second material includes one of a hexagonal boron nitride, a chalcogenide-based material, or a precursor thereof.

* * * * *